(12) United States Patent  
Yokota et al.

(10) Patent No.: US 11,178,786 B2  
(45) Date of Patent: Nov. 16, 2021

(54) METHOD FOR MANUFACTURING HERMETIC SEALING LID MEMBER

(71) Applicant: HITACHI METALS, LTD., Tokyo (JP)

(72) Inventors: Masayuki Yokota, Suita (JP); Masaharu Yamamoto, Suita (JP)

(73) Assignee: HITACHI METALS, LTD., Tokyo (JP)

( * ) Notice: Subject to any disclaimer, the term of this patent is extended or adjusted under 35 U.S.C. 154(b) by 179 days.

(21) Appl. No.: 16/433,910

(22) Filed: Jun. 6, 2019

(65) Prior Publication Data

US 2019/0289738 A1    Sep. 19, 2019

Related U.S. Application Data

(62) Division of application No. 15/536,285, filed as application No. PCT/JP2015/085964 on Dec. 24, 2015, now Pat. No. 10,595,424.

(30) Foreign Application Priority Data

Dec. 26, 2014  (JP) .................................. 2014-264538

(51) Int. Cl.
*B23K 20/00* (2006.01)
*H05K 5/06* (2006.01)
(Continued)

(52) U.S. Cl.
CPC ............... *H05K 5/066* (2013.01); *B23K 1/00* (2013.01); *B23K 1/0016* (2013.01); *B23K 1/20* (2013.01);
(Continued)

(58) Field of Classification Search
CPC . H05K 5/066; H05K 5/03; B23K 1/00; B23K 1/20; B23K 1/0016; B23K 20/04;
(Continued)

(56) References Cited

U.S. PATENT DOCUMENTS 5,616,520 A * 4/1997 Nishiuma ............... H01L 23/10  
438/125  
5,621,243 A * 4/1997 Baba .................. H01L 23/3735  
257/712  
(Continued)

FOREIGN PATENT DOCUMENTS

DE    102006031469 A1 * 10/2008  
JP      02155581 A   *  6/1990  
(Continued)

OTHER PUBLICATIONS

Machine translation of DE-102006031469A1 (no date available).*

(Continued)

*Primary Examiner* — Kiley S Stoner  
(74) *Attorney, Agent, or Firm* — Westerman, Hattori, Daniels & Adrian, LLP

(57) ABSTRACT

The method manufactures a hermetic sealing lid member used for an electronic component housing package including an electronic component arrangement member on which an electronic component is arranged. The method includes forming a clad material in which a silver brazing layer that contains Ag and Cu and a first Fe layer arranged on the silver brazing layer and made of Fe or an Fe alloy are bonded to each other by roll-bonding a silver brazing plate that contains Ag and Cu and a first Fe plate made of Fe or an Fe alloy to each other and performing first heat treatment for diffusion annealing; softening the clad material by performing second heat treatment; and forming the hermetic sealing lid member in a box shape including a recess portion by bending the softened clad material.

5 Claims, 10 Drawing Sheets

(51) Int. Cl.
| | |
|---|---|
| *B23K 20/04* | (2006.01) |
| *B23K 1/00* | (2006.01) |
| *B23K 1/20* | (2006.01) |
| *H01L 21/48* | (2006.01) |
| *H01L 23/06* | (2006.01) |
| *H01L 41/053* | (2006.01) |
| *H01L 41/23* | (2013.01) |
| *H03H 9/10* | (2006.01) |
| *H05K 5/03* | (2006.01) |
| *B23K 101/40* | (2006.01) |
| *B32B 15/01* | (2006.01) |
| *B23K 35/30* | (2006.01) |

(52) U.S. Cl.
 CPC .......... *B23K 20/04* (2013.01); *H01L 21/4817* (2013.01); *H01L 23/06* (2013.01); *H01L 41/0533* (2013.01); *H01L 41/23* (2013.01); *H03H 9/10* (2013.01); *H05K 5/03* (2013.01); *B23K 35/3006* (2013.01); *B23K 2101/40* (2018.08); *B32B 15/015* (2013.01); *H01L 2224/16* (2013.01); *H01L 2924/0002* (2013.01); *H01L 2924/16152* (2013.01); *H03H 9/1021* (2013.01); *Y10T 428/12896* (2015.01); *Y10T 428/12951* (2015.01)

(58) Field of Classification Search
 CPC ............ B23K 2101/40; B23K 35/3006; B23K 20/026; B23K 1/0008; B23K 1/001; B23K 35/0233; B23K 35/0238; B23K 35/302; H03H 9/10; H03H 9/1021; H03H 3/02; H03H 9/02; B32B 15/015; Y10T 428/12951; Y10T 428/12896; H01L 2224/16; H01L 21/4817; H01L 23/06; H01L 41/0533; H01L 41/23; H01L 2924/0002; H01L 2924/16152; H01L 23/02
 USPC ............... 228/13–195, 235.2, 262.4–262.45, 228/262.6–262.61
 See application file for complete search history.

(56) References Cited

U.S. PATENT DOCUMENTS

| | | | |
|---|---|---|---|
| 7,142,435 B2 | 11/2006 | Goto et al. | |
| 2004/0094320 A1 | 5/2004 | Goto et al. | |
| 2004/0131879 A1* | 7/2004 | Wittebrood | C23C 26/00 |
| | | | 428/650 |
| 2004/0207071 A1 | 10/2004 | Shiomi et al. | |
| 2005/0104481 A1 | 5/2005 | Sunaba et al. | |
| 2005/0214979 A1 | 9/2005 | Suzuki et al. | |
| 2008/0020225 A1 | 1/2008 | Saito et al. | |
| 2012/0292294 A1* | 11/2012 | Oda | H01M 50/502 |
| | | | 219/118 |
| 2015/0232244 A1 | 8/2015 | Yokota et al. | |
| 2015/0342072 A1* | 11/2015 | Nishina | C22C 5/08 |
| | | | 277/630 |

FOREIGN PATENT DOCUMENTS

| | | | |
|---|---|---|---|
| JP | 6-45485 A | 2/1994 | |
| JP | 11-191601 A | 7/1997 | |
| JP | 2001-156193 A | 6/2001 | |
| JP | 2002-30393 A | 1/2002 | |
| JP | 2003-158211 A | 5/2003 | |
| JP | 2003-209197 A | 7/2003 | |
| JP | 2005-176319 A | 6/2005 | |
| JP | 2006-49595 A | 2/2006 | |
| JP | 2007-43106 A | 2/2007 | |
| JP | 2007142231 A * | 6/2007 | |
| JP | 2009-170782 A | 7/2009 | |
| TW | 560028 B | 11/2003 | |
| TW | 200403818 A | 3/2004 | |
| TW | 201431008 A | 8/2014 | |
| WO | 2005/048285 A1 | 5/2005 | |
| WO | 2006/098233 A1 | 9/2006 | |

OTHER PUBLICATIONS

Final Office Action dated Sep. 12, 2019, issued in U.S. Appl. No. 15/536,285. (9 pages).
International Search Report dated Mar. 15, 2016, issued in counterpart of International Application No. PCT/JP2015/085964.
Office Action dated May 31, 2017, issued in counterpart Taiwanese Application No. 104143806.
Office Action dated Dec. 15, 2017, issued in counterpart Taiwanese Application No. 104143806.
Office Action dated May 8, 2018, issued in counterpart Japanese application No. 2014-264538.
Office Action dated May 9, 2018, issued in counterpart Korean application No. 10-2017-7012049.
Extended (supplementary) European Search Report dated Aug. 14, 2018, issued in counterpart European Application No. 15873144.8.
Office Action dated Nov. 2, 2018, issued in counterpart Chinese Application No. 201580070689.8.
Non Final Office Action dated Apr. 4, 2019, issued in U.S. Appl. No. 15/536,285.

* cited by examiner

FIG.7 SECTIONAL PHOTOGRAPH ACCORDING TO EXAMPLE 1

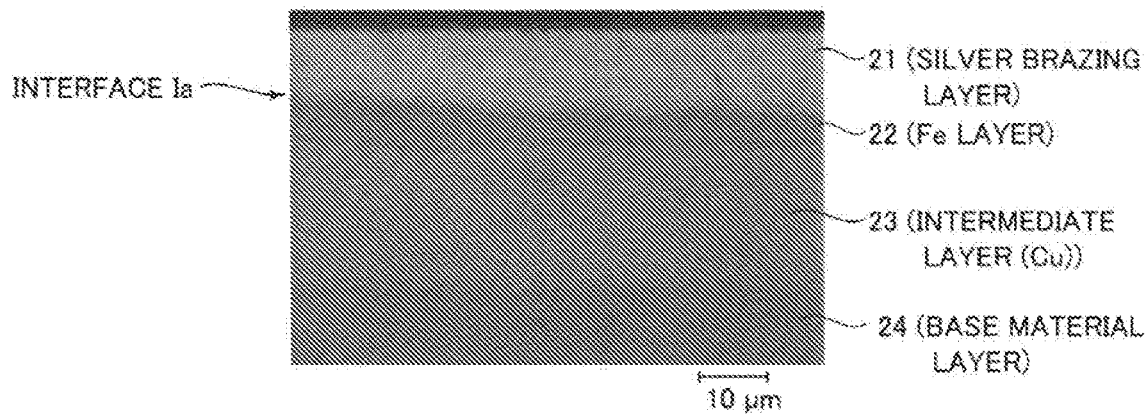

- INTERFACE Ia
- 21 (SILVER BRAZING LAYER)
- 22 (Fe LAYER)
- 23 (INTERMEDIATE LAYER (Cu))
- 24 (BASE MATERIAL LAYER)

10 μm

FIG.8 SECTIONAL PHOTOGRAPH ACCORDING TO EXAMPLE 2

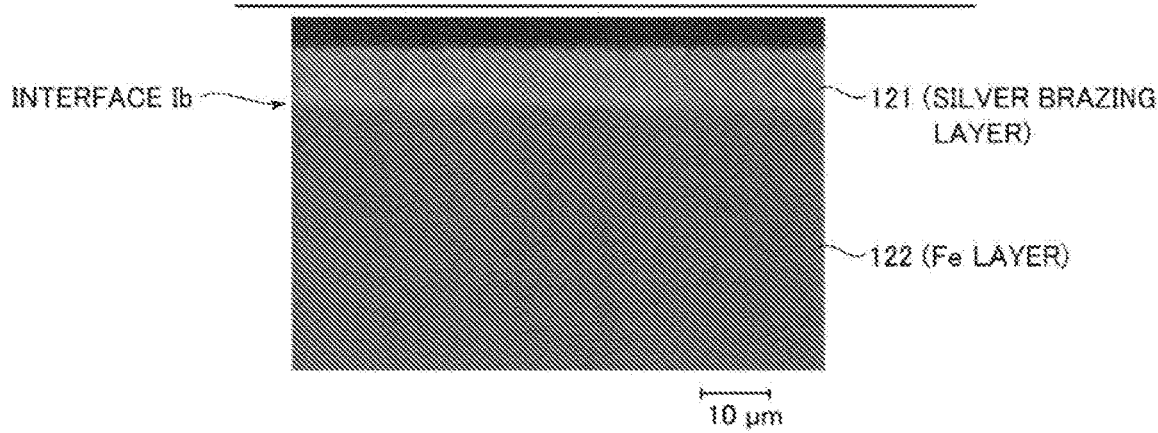

- INTERFACE Ib
- 121 (SILVER BRAZING LAYER)
- 122 (Fe LAYER)

10 μm

FIG.9 SECTIONAL PHOTOGRAPH ACCORDING TO COMPARATIVE EXAMPLE 1

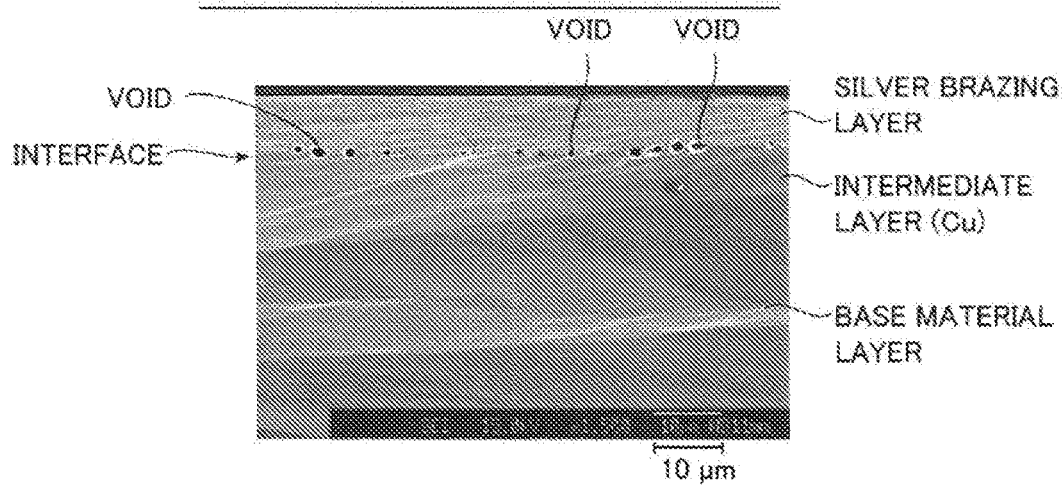

- VOID
- VOID
- VOID
- INTERFACE
- SILVER BRAZING LAYER
- INTERMEDIATE LAYER (Cu)
- BASE MATERIAL LAYER

10 μm

FIG.10 SECTIONAL PHOTOGRAPH ACCORDING TO COMPARATIVE EXAMPLE 2
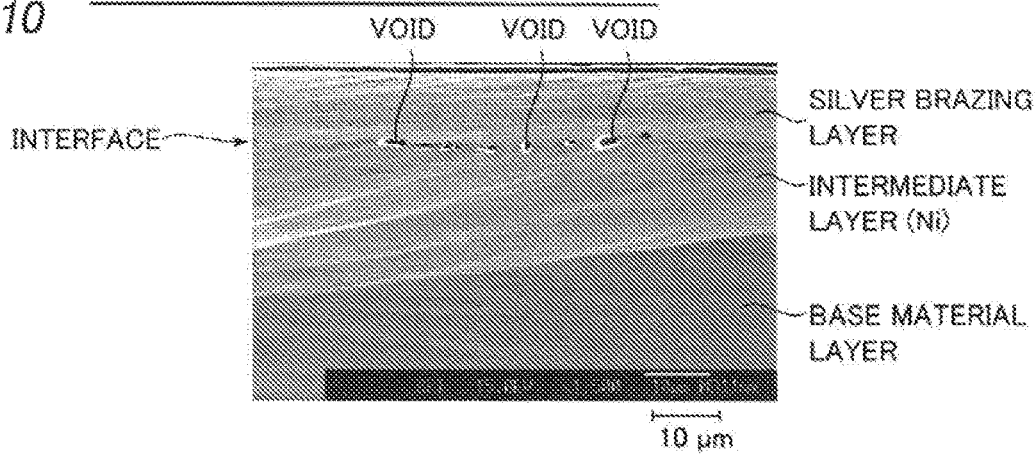
FIG.11 SURFACE PHOTOGRAPH ACCORDING TO COMPARATIVE EXAMPLE 1
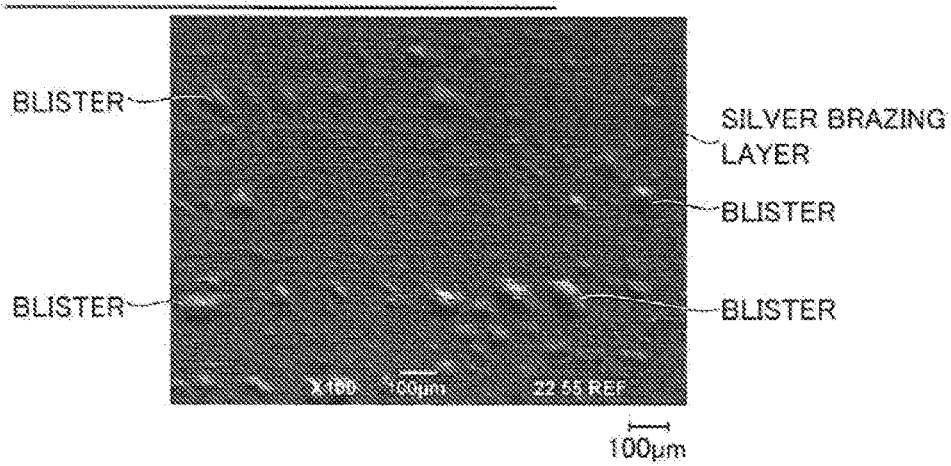
FIG.12
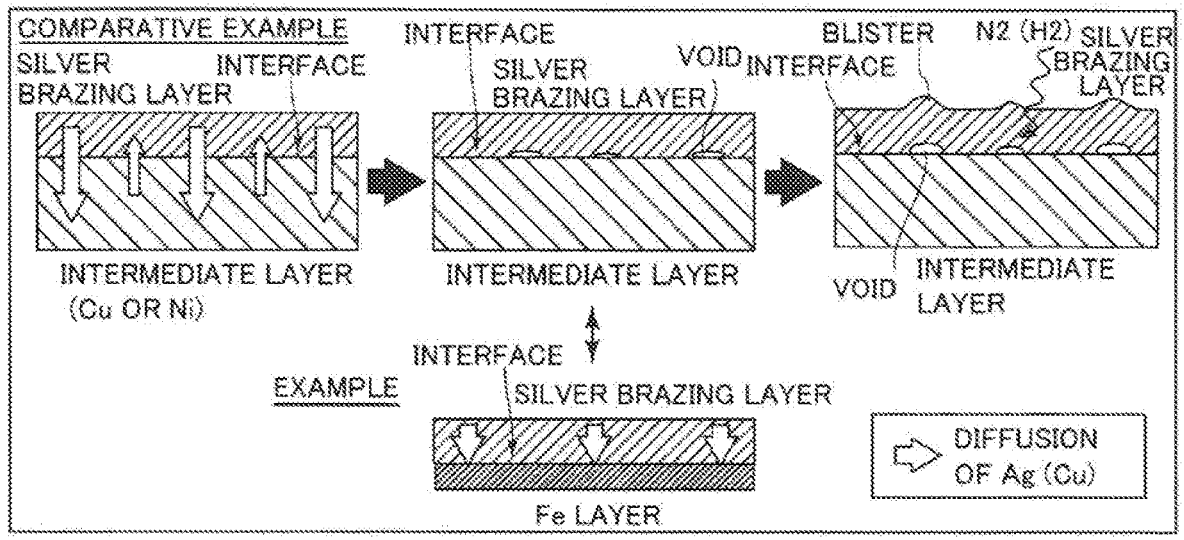

FIG.13
|  | EXAMPLE 1 | EXAMPLE 2 |
|---|---|---|
| FRACTURE ELONGATION (%) | 21.8 | 27.9 |
| VICKERS HARDNESS (HV) | 157 (BASE MATERIAL LAYER) | 160 (Fe LAYER) |
FIG.14
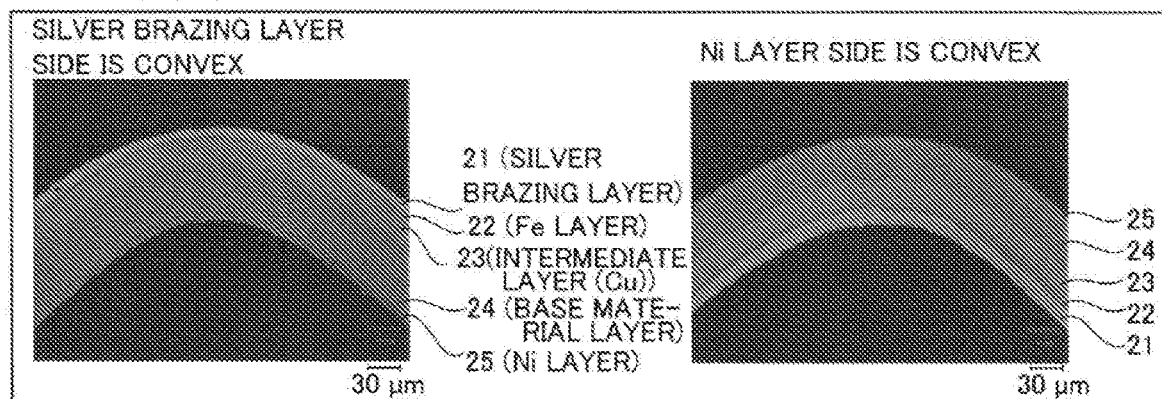
EXAMPLE 1
FIG.15
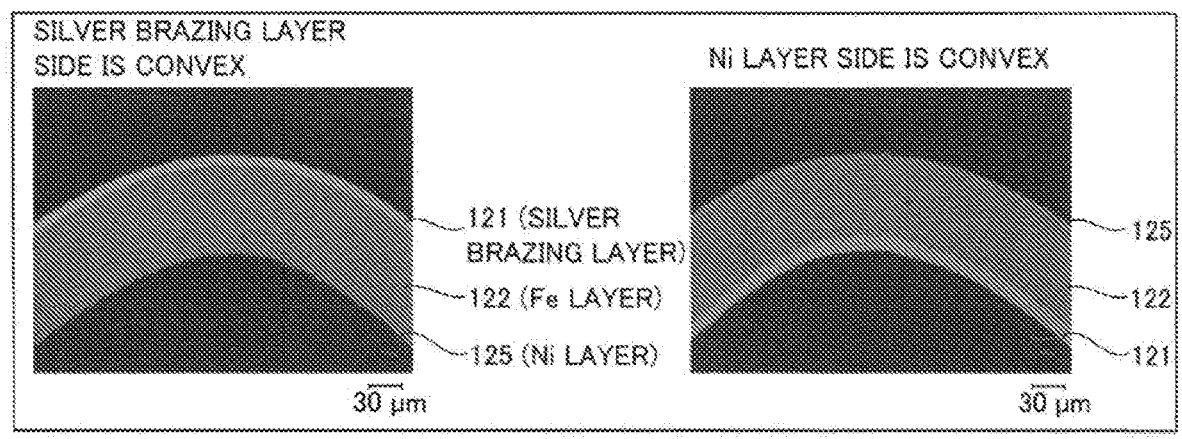
EXAMPLE 2

FIG.16 SECTIONAL PHOTOGRAPH ACCORDING TO EXAMPLE 11 (72Ag-Cu/Fe)
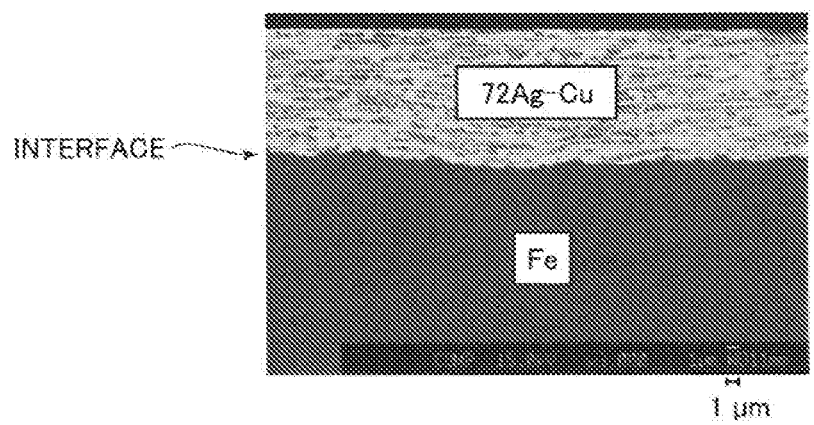
FIG.17 SECTIONAL PHOTOGRAPH ACCORDING TO EXAMPLE 12 (72Ag-Cu/29Ni-17Co-Fe)
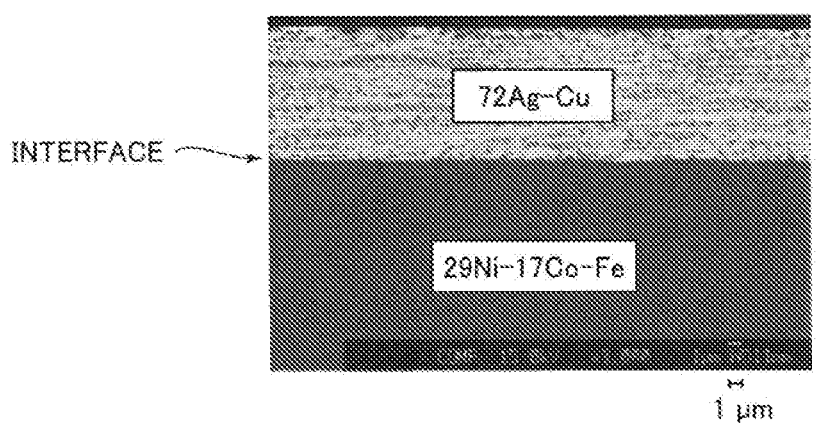
FIG.18 SECTIONAL PHOTOGRAPH ACCORDING TO EXAMPLE 13 (72Ag-Cu/36Ni-Fe)
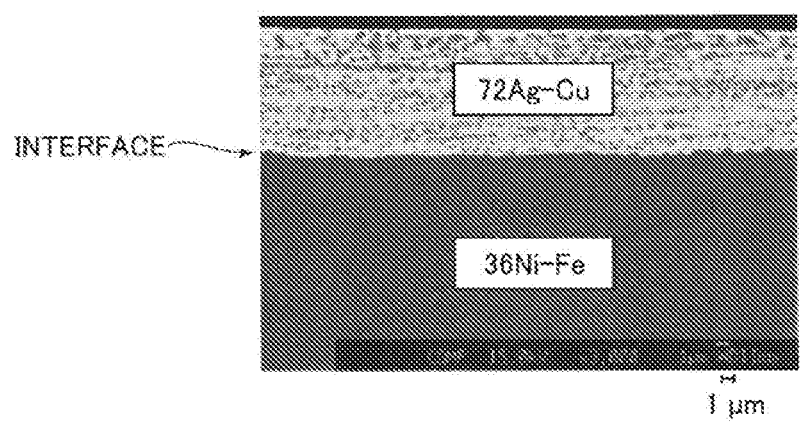

FIG.19  SECTIONAL PHOTOGRAPH ACCORDING TO EXAMPLE 14 (72Ag-Cu/50Ni-Fe)
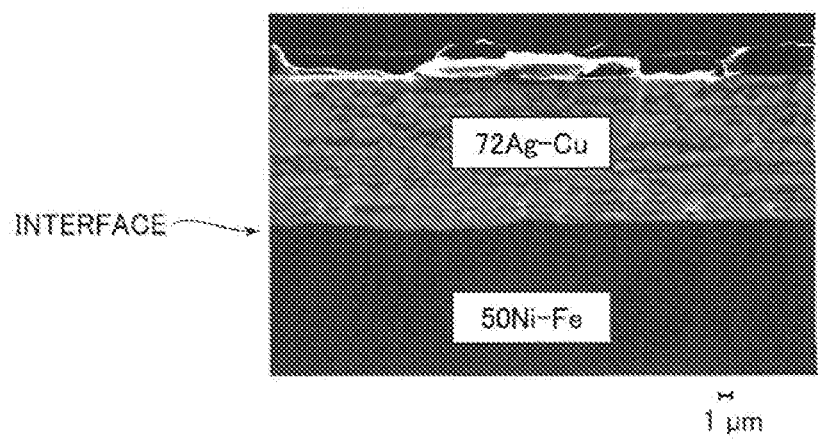
FIG.20  SECTIONAL PHOTOGRAPH ACCORDING TO EXAMPLE 15 (72Ag-Cu/42Ni-6Cr-Fe)
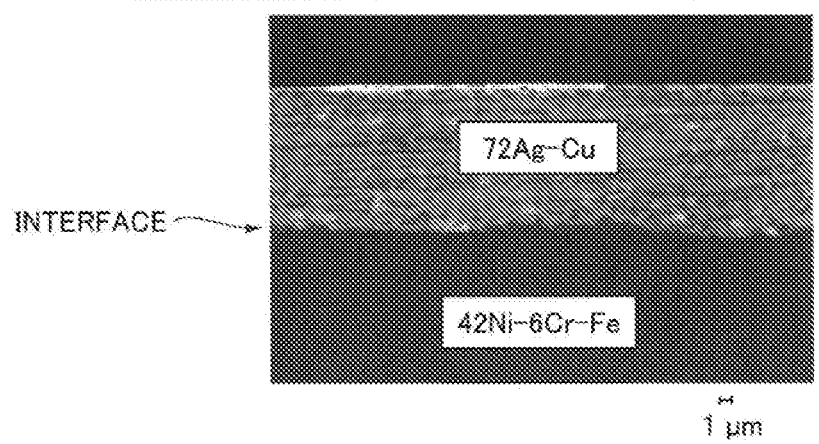
FIG.21  SECTIONAL PHOTOGRAPH ACCORDING TO EXAMPLE 16 (72Ag-Cu/18Cr-Fe)
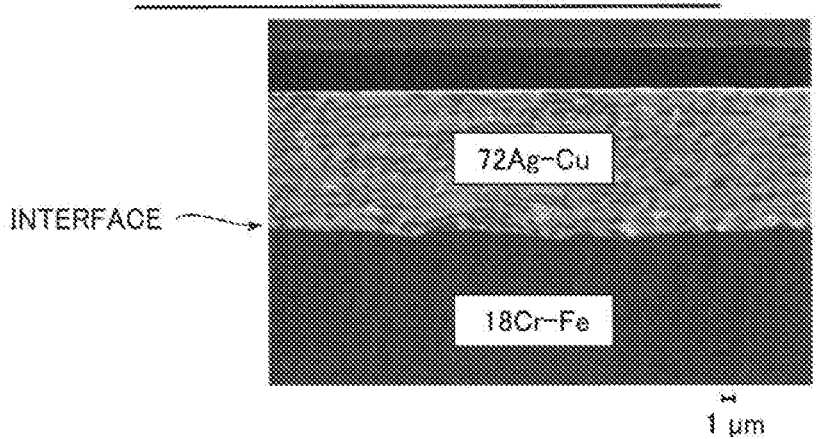

FIG.22  SECTIONAL PHOTOGRAPH ACCORDING TO COMPARATIVE EXAMPLE 11 (72Ag-Cu/Cu)
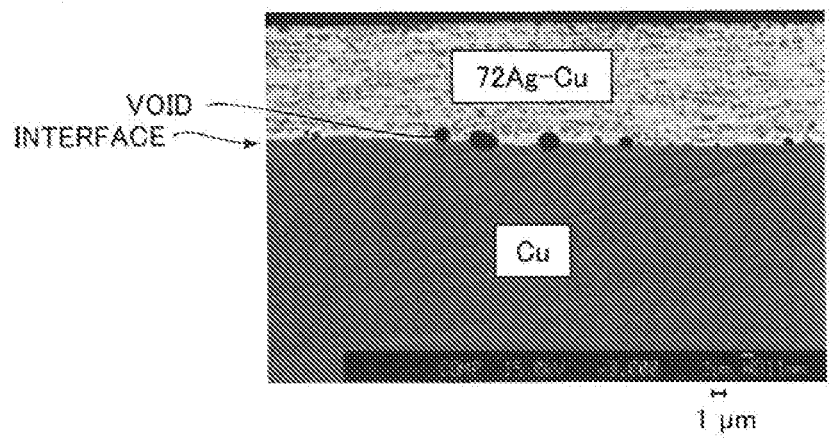
FIG.23  SECTIONAL PHOTOGRAPH ACCORDING TO COMPARATIVE EXAMPLE 12 (72Ag-Cu/Ni)
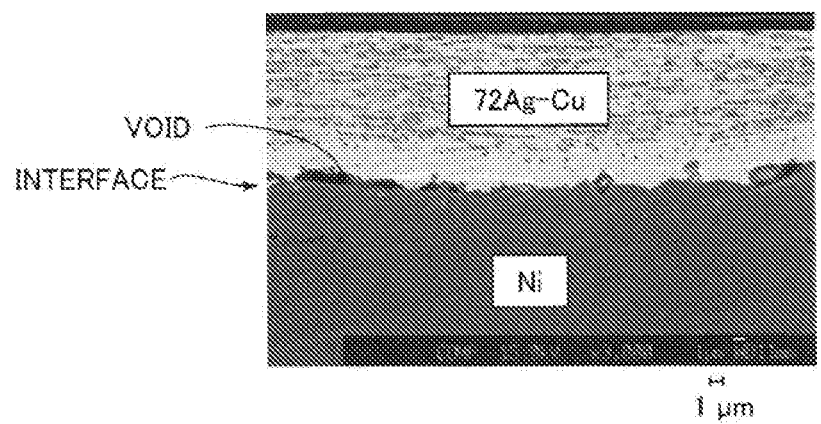
FIG.24  SECTIONAL PHOTOGRAPH ACCORDING TO COMPARATIVE EXAMPLE 13 (72Ag-Cu/30Ni-Cu)
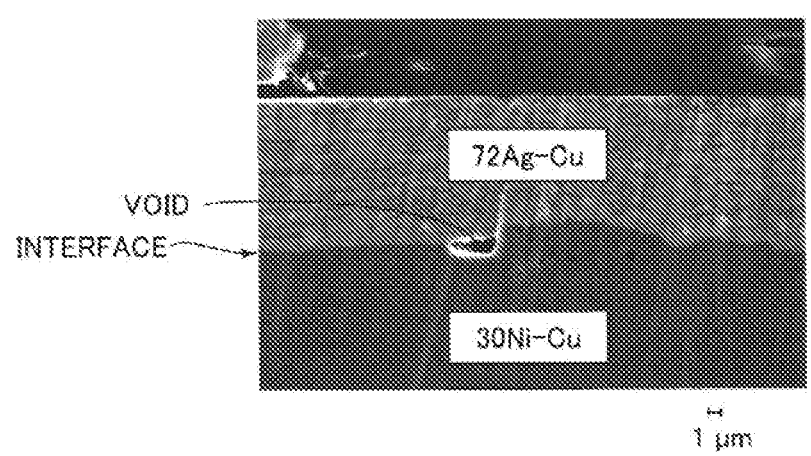

FIG.25  SURFACE PHOTOGRAPH ACCORDING TO EXAMPLE 11 (72Ag-Cu/Fe)
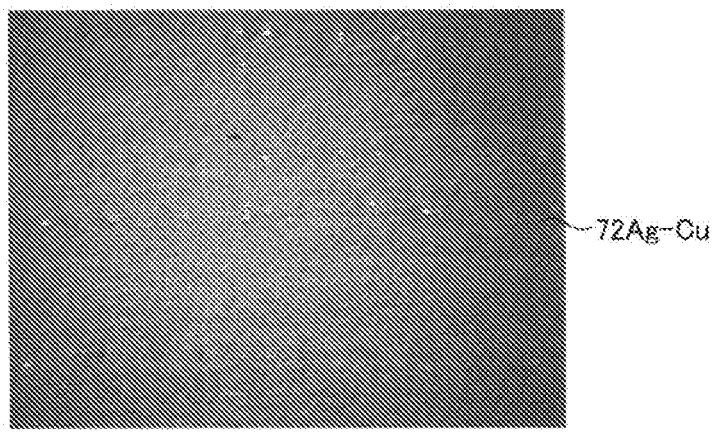
FIG.26  SURFACE PHOTOGRAPH ACCORDING TO COMPARATIVE EXAMPLE 11 (72Ag-Cu/Cu)
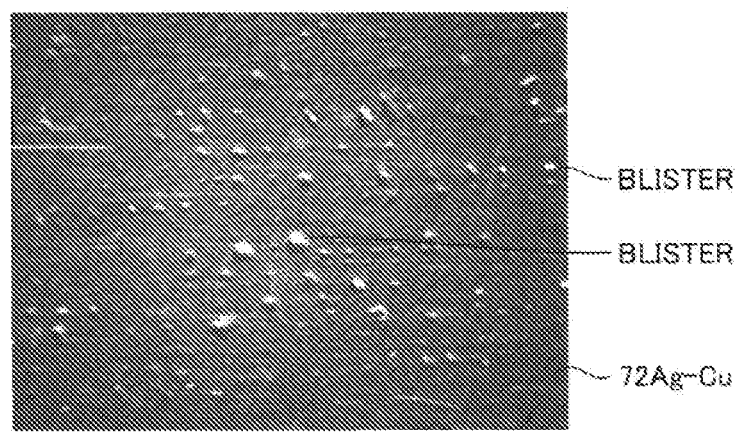
FIG.27  SURFACE PHOTOGRAPH ACCORDING TO COMPARATIVE EXAMPLE 12 (72Ag-Cu/Cu)
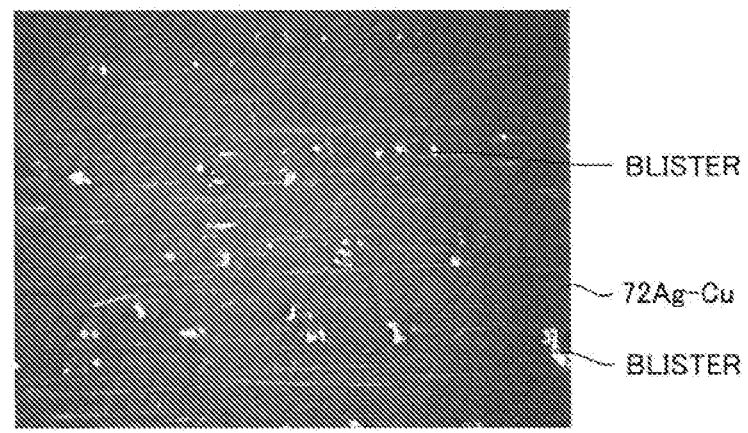

FIG.28  SECTIONAL PHOTOGRAPH ACCORDING TO EXAMPLE 21 (85Ag-Cu/29Ni-17Co-Fe)
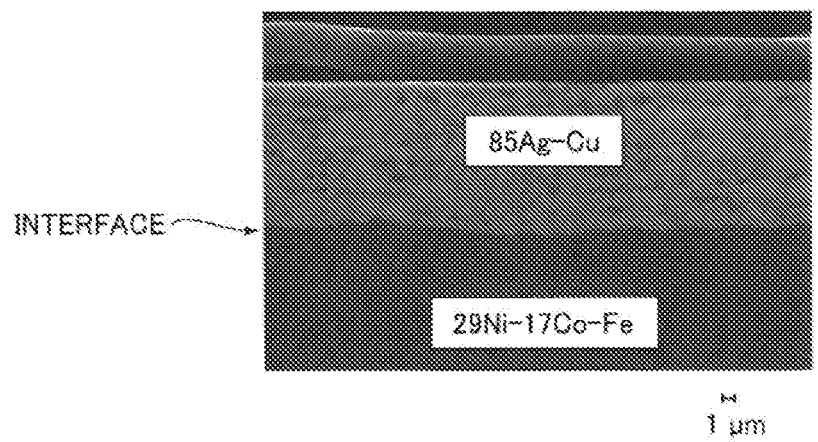
FIG.29  SECTIONAL PHOTOGRAPH ACCORDING TO COMPARATIVE EXAMPLE 21 (85Ag-Cu/Cu)
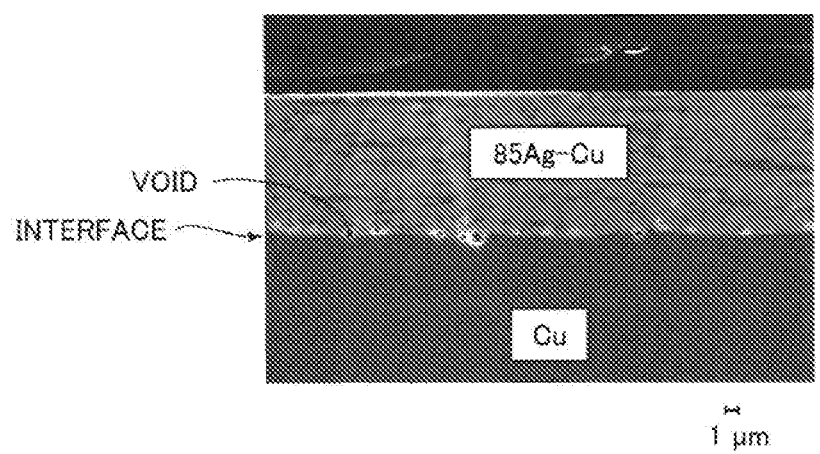

METHOD FOR MANUFACTURING HERMETIC SEALING LID MEMBER

CROSS-REFERENCE TO RELATED APPLICATION

This application is a divisional of U.S. application Ser. No. 15/536,285, filed on Jun. 15, 2017, which is a 371 of International Application No. PCT/JP2015/085964 filed on Dec. 24, 2015, which claims the benefit of priority of Japanese Patent Application No. 2014-264538 filed on Dec. 26, 2014.

TECHNICAL FIELD

The present invention relates to a hermetic sealing lid member, a method for manufacturing a hermetic sealing lid member, and an electronic component housing package.

BACKGROUND ART

An electronic component housing package that includes a hermetic sealing lid member including a brazing material layer is known in general. Such an electronic component housing package is disclosed in Japanese Patent Laid-Open No. 2003-158211 and Japanese Patent Laid-Open No. 2001-156193, for example.

Japanese Patent Laid-Open No. 2003-158211 discloses an electronic component package including a metal lid made of a clad material in which a Ag brazing layer, a Cu layer, a metal base material that contains kovar (registered trademark), a Ni layer are bonded to each other in a stacked state and a ceramic package in which a crystal oscillation plate is housed. The Cu layer is provided to relieve thermal stress after welding and relieve heat distortion at the time of the welding. In this electronic component package, the metal lid (clad material) is formed in a flat plate shape, but the ceramic package is formed in a box shape including a recess portion to house the crystal oscillation plate.

Japanese Patent Laid-Open No. 2001-156193 discloses an electronic component package including a metal plate made of kovar, a metal lid member that includes a brazing material layer bonded to the lower surface of the metal plate and made of a low-melting-point brazing material, and a plated layer made of Ni or the like adhering to the upper surface of the metal plate by plating and is formed in a box shape having a recess portion, and a ceramic substrate (electronic component arrangement member) in which a crystal unit is housed. Japanese Patent Laid-Open No. 2001-156193 discloses a Au alloy, Sn, a solder, and an aluminum alloy as the low-melting-point brazing material.

The flat plate-shaped metal lid including the Ag brazing layer, which is described in Japanese Patent Laid-Open No. 2003-158211, is formed in a box shape including a recess portion as the metal lid member including the brazing material layer made of the low-melting-point brazing material, which is described in Japanese Patent Laid-Open No. 2001-156193, such that the ceramic package is conceivably reduced in size while the productivity of the ceramic package is improved by suppressing complication of the shape of the ceramic package made of ceramic, which is difficult to process as compared with a metal material. The metal lid constitutes a side wall of the electronic component package such that the stiffness of the side wall can also be improved.

PRIOR ART DOCUMENT

Patent Document

Patent Document 1: Japanese Patent Laying-Open No. 2003-158211
Patent Document 2: Japanese Patent Laying-Open No. 2001-156193

SUMMARY OF THE INVENTION

Problems to be Solved by the Invention

However, the present inventors have found that when the flat plate-shaped clad material including the Ag brazing layer, which is described in Japanese Patent Laying-Open No. 2003-158211, is bent into the box shape including the recess portion to form the metal lid as the metal lid member including the brazing material layer made of the low-melting-point brazing material, which is described in Japanese Patent Laying-Open No. 2001-156193, the metal base material made of the kovar is hard such that cracks are likely to occur on a bent portion. Furthermore, the present inventors have found that when heat treatment (softening heat treatment) for softening is performed on the clad material including the Ag brazing layer in order to suppress occurrence of the cracks, softening treatment can be performed on the clad material without melting the Ag brazing layer, but there is such a problem that voids occur on an interface between the Ag brazing layer and the Cu layer. The term "voids" denotes clearances generated by separating the two layers from each other on the interface therebetween.

Although not clearly stated, even in the metal lid member described in Japanese Patent Laying-Open No. 2001-156193, the metal plate made of the kovar is hard such that cracks are conceivably likely to occur on a bent portion when the metal plate is bent into the box shape having the recess portion. When heat treatment (softening heat treatment) for softening is performed on the metal lid member including the brazing material layer made of the low-melting-point brazing material in order to suppress occurrence of the cracks, the low-melting-point brazing material is conceivably melted before the kovar is softened such that sufficient softening treatment cannot be performed.

When the cracks occur on the lid member, as described above, fractures are likely to progress from the cracks, and hence the electronic component package using the lid member may not be sufficiently hermetically sealed. When the voids occur in the metal lid including the Ag brazing layer, the Ag brazing layer around the voids is possibly likely to be separate. Furthermore, when atmosphere gas, residual gas, or the like flows in the voids of the metal lid, the same may be released at the time of braze bonding or after the braze bonding. In this case, at the time of braze bonding, silver brazing material is splattered together with the released gas such that insufficient braze bonding may occur or the silver brazing material may adhere to the crystal oscillation plate. After the braze bonding, the gas that has flowed in the voids is released into a sealed space of the electronic component package such that an electronic component of the electronic component package may malfunction.

The present invention has been proposed in order to solve the aforementioned problems, and an object of the present invention is to provide a hermetic sealing lid member in which occurrence of both cracks and voids is suppressed even when a clad material including a silver brazing layer is formed in a box shape including a recess portion, a method for manufacturing the hermetic sealing lid member, and an electronic component housing package including the hermetic sealing lid member.

Means for Solving the Problems

As a result of further investigations on the aforementioned found problems, the present inventors have found that Ag and Cu contained in a silver brazing layer are diffused into a Cu layer due to softening heat treatment such that a silver brazing component of the silver brazing layer in the vicinity of an interface is reduced, and hence voids occur on the interface between the silver brazing layer and the Cu layer directly bonded to the silver brazing layer. This phenomenon occurred also in the case of Ni and a Ni—Cu alloy in addition to Cu. As a result of earnest investigations based on the findings, the present inventors have found that the aforementioned problems can be solved by the following structure. In other words, a hermetic sealing lid member according to a first aspect of the present invention is a hermetic sealing lid member used for an electronic component housing package including an electronic component arrangement member on which an electronic component is arranged, is made of a clad material including a silver brazing layer that contains Ag and Cu and a first Fe layer bonded onto the silver brazing layer and made of Fe or an Fe alloy, and is formed in a box shape including a recess portion by bending the clad material.

As hereinabove described, the hermetic sealing lid member according to the first aspect of the present invention is made of the clad material including the first Fe layer bonded onto the silver brazing layer and made of Fe or the Fe alloy. Even when softening heat treatment is performed, Ag and Cu contained in the silver brazing layer is hardly solid-dissolved in the first Fe layer made of Fe or the Fe alloy, and hence solid solution diffusion hardly occurs. Thus, diffusion of Ag and Cu contained in the silver brazing layer into the first Fe layer can be suppressed. Furthermore, when the first Fe layer is arranged between the silver brazing layer and another metal layer made of Ni or the like, for example, diffusion of Ag and Cu contained in the silver brazing layer into another metal layer can be suppressed by the first Fe layer. Thus, even when the softening heat treatment is performed, a reduction in a silver brazing component located in the vicinity of an interface between the silver brazing layer and the first Fe layer directly bonded to the silver brazing layer or another metal layer caused by diffusion of the silver brazing component can be suppressed, and hence occurrence of voids on the interface can be suppressed. It has been confirmed in an experiment described later that occurrence of voids can be suppressed by this first Fe layer. Thus, the softened clad material can be bent, and hence occurrence of cracks on a bent portion can be suppressed. Consequently, when the clad material including the silver brazing layer is formed in the box shape including the recess portion, occurrence of cracks can be suppressed.

In the aforementioned hermetic sealing lid member according to the first aspect, the first Fe layer is preferably made of the Fe alloy that contains at least one of Co and Cr, and preferably contains 50 mass % or more of Fe, Co, and Cr in total. According to this structure, even when the softening heat treatment is performed, Ag and Cu contained in the silver brazing layer are hardly solid-dissolved in the first Fe layer made of the Fe alloy that contains at least one of Co and Cr such that diffusion of Ag and Cu contained in the silver brazing layer into the first Fe layer can be suppressed. Furthermore, the first Fe layer contains 50 mass % or more of Fe, Co, and Cr in total such that diffusion of Ag and Cu contained in the silver brazing layer into the first Fe layer can be sufficiently suppressed. This has been confirmed in the experiment described later.

In the aforementioned hermetic sealing lid member according to the first aspect, the clad material preferably further includes an intermediate layer that is bonded onto the first Fe layer and contains at least one of Cu and Ni and a second Fe layer bonded onto the intermediate layer and made of Fe or an Fe alloy. The intermediate layer includes a layer that contains one of Cu and Ni in which Ag and Cu are solid-dissolved, and hence when the silver brazing layer and the intermediate layer are in direct contact with each other, Ag and Cu of the silver brazing layer are likely to be diffused into the intermediate layer. As described above, the first Fe layer is arranged between the intermediate layer and the silver brazing layer such that diffusion of Ag and Cu contained in the silver brazing layer into the intermediate layer can be suppressed by the first Fe layer even when the softening heat treatment is performed. Furthermore, when the intermediate layer is made of Cu, the intermediate layer can be softened to some extent, and hence heat distortion at the time of braze bonding of the second Fe layer and the electronic component arrangement member to each other and thermal stress caused by a difference in thermal expansion after the braze bonding can be relieved in the intermediate layer. In addition, the composition and thickness of the second Fe layer made of Fe or the Fe alloy are adjusted such that the mechanical strength of the hermetic sealing lid member can be easily adjusted.

In this case, the first Fe layer preferably has a thickness of at least 1 μm and not more than a thickness of the intermediate layer. When the thickness of the first Fe layer is at least 1 μm, the thickness of the first Fe layer can be sufficiently ensured, and hence diffusion of Ag and Cu contained in the silver brazing layer into the intermediate layer can be sufficiently suppressed by the first Fe layer. Furthermore, the first Fe layer has the thickness of not more than the thickness of the intermediate layer such that an excessive increase in the thickness of the first Fe layer can be suppressed, and hence insufficient relief of heat distortion at the time of braze bonding of the hermetic sealing lid member and the electronic component arrangement member to each other and thermal stress caused by a difference in thermal expansion after the braze bonding in the intermediate layer made of Cu can be suppressed.

In the aforementioned structure in which the clad material includes the intermediate layer and the second Fe layer, the second Fe layer of the clad material preferably has a Vickers hardness of 110 HV or more and 200 HV or less. When the Vickers hardness of the second Fe layer is 200 HV or less, the second Fe layer is sufficiently softened, and hence the clad material including the second Fe layer can be easily bent. Thus, the clad material can be easily bent into the box shape including the recess portion. Furthermore, when the Vickers hardness of the second Fe layer is 110 HV or more, the hardness of the second Fe layer is not excessively small, and hence easy deformation of the hermetic sealing lid member caused by an external force or the like can be suppressed.

In the aforementioned structure in which the clad material includes the intermediate layer and the second Fe layer, the second Fe layer of the clad material preferably has a thickness of 50% or more of a thickness of the clad material. When the thickness of the second Fe layer is 50% or more of the thickness of the clad material, parameters such as the mechanical strength and thermal expansion coefficient of the clad material can be mainly determined by the second Fe layer, and hence materials (various elements to be added other than Fe) for the second Fe layer are properly selected such that the hermetic sealing lid member excellent in airtightness or the like can be prepared.

In the aforementioned hermetic sealing lid member according to the first aspect, the first Fe layer is preferably made of an Fe alloy that contains more than 0 mass % and not more than 50 mass % of Ni. When the first Fe layer is made of the Fe alloy that contains Ni, the thermal expansion coefficient of the first Fe layer can be reduced. Thus, the thermal expansion coefficient of the clad material can be reduced, and hence a large difference in thermal expansion between the electronic component arrangement member made of ceramic having a small thermal expansion coefficient and the hermetic sealing lid member can be suppressed. Furthermore, when the first Fe layer is made of the Fe alloy that contains not more than 50 mass % of Ni, easy diffusion of Ag and Cu contained in the silver brazing layer into the first Fe layer can be suppressed.

In the aforementioned hermetic sealing lid member according to the first aspect, the clad material preferably has a rate of elongation of 10% or more. When the rate of elongation of the clad material is 10% or more, the clad material is sufficiently softened, and hence the clad material can be easily bent. Thus, the clad material can be easily bent into the box shape including the recess portion.

In the aforementioned hermetic sealing lid member according to the first aspect, the clad material preferably further includes a Ni layer that constitutes an outermost layer on a side opposite to the silver brazing layer and contains Ni. When the Ni layer is provided on the outermost layer of the clad material exposed outward, the corrosion resistance of the exposed surface of the clad material can be improved by the Ni layer. Thus, a reduction in the airtightness of the electronic component housing package using the hermetic sealing lid member caused by corrosion of the hermetic sealing lid member can be effectively suppressed.

A method for manufacturing a hermetic sealing lid member according to a second aspect of the present invention is a method for manufacturing a hermetic sealing lid member used for an electronic component housing package including an electronic component arrangement member on which an electronic component is arranged, and includes forming a clad material in which a silver brazing layer that contains Ag and Cu and a first Fe layer arranged on the silver brazing layer and made of Fe or an Fe alloy are bonded to each other by roll-bonding a silver brazing plate that contains Ag and Cu and a first Fe plate made of Fe or an Fe alloy to each other and performing first heat treatment for diffusion annealing, softening the clad material by performing second heat treatment, and forming the hermetic sealing lid member in a box shape including a recess portion by bending the softened clad material.

As hereinabove described, the method for manufacturing a hermetic sealing lid member according to the second aspect of the present invention includes softening the clad material by performing second heat treatment on the clad material provided with the first Fe layer bonded onto the silver brazing layer and made of Fe or the Fe alloy. In the above softened clad material having the first Fe layer, Ag and Cu are not solid solution diffused from the silver brazing layer such that occurrence of voids is suppressed, and occurrence of cracks can be suppressed even when the clad material is formed in the box shape including the recess portion.

In the aforementioned method for manufacturing a hermetic sealing lid member according to the second aspect, the softening of the clad material preferably includes performing the second heat treatment at a temperature of at least 700° C. and less than a melting point of the silver brazing layer or performing the second heat treatment for a longer time than a time of the first heat treatment at a temperature of at least 650° C. and less than 700° C. The temperature of at least 700° C. and less than the melting point of the silver brazing layer is defined since it is preferable to set the temperature to a temperature at which even a silver brazing material having a high melting point among brazing materials is not melted. According to this structure, the second heat treatment is performed at the temperature of at least about 700° C. and less than the melting point of the silver brazing layer such that the second heat treatment can be performed at a sufficiently high temperature that does not allow melting of the silver brazing layer, and hence the clad material can be sufficiently softened. Even in a temperature range of at least about 650° C. and less than about 700° C., the second heat treatment is performed for a longer time than the time of the first heat treatment in the forming of the clad material such that the clad material can be softened to an extent that allows the clad material to be formed into the box shape including the recess portion. Thus, occurrence of cracks on the clad material in bending can be effectively suppressed.

The aforementioned method for manufacturing a hermetic sealing lid member according to the second aspect preferably includes forming the clad material in which the silver brazing layer, the first Fe layer, an intermediate layer that is arranged on the first Fe layer and contains at least one of Cu and Ni, and a second Fe layer arranged on the intermediate layer and made of Fe or an Fe alloy are bonded to each other by roll-bonding the silver brazing plate, the first Fe plate, a plate for the intermediate layer that contains at least one of Cu and Ni, and a second Fe plate made of Fe or an Fe alloy to each other and performing the first heat treatment. According to this structure, the first Fe layer is arranged between the intermediate layer and the silver brazing layer such that diffusion of Ag and Cu contained in the silver brazing layer into the intermediate layer in the second heat treatment can be suppressed by the first Fe layer. Furthermore, the composition and thickness of the second Fe layer made of Fe or the Fe alloy are adjusted such that the mechanical strength of the hermetic sealing lid member can be easily adjusted.

In the aforementioned method for manufacturing a hermetic sealing lid member according to the second aspect, the softening of the clad material preferably includes setting a Vickers hardness of the second Fe layer of the clad material to 110 HV or more and 200 HV or less by performing the second heat treatment. When the Vickers hardness of the second Fe layer is 200 HV or less, the clad material can be easily bent into the box shape including the recess portion. When the Vickers hardness of the second Fe layer is 110 HV or more, easy deformation of the hermetic sealing lid member caused by an external force or the like can be suppressed.

In the aforementioned method for manufacturing a hermetic sealing lid member according to the second aspect, the softening of the clad material preferably includes softening the clad material such that the clad material has a rate of elongation of 10% or more by performing the second heat treatment. When the rate of elongation of the clad material is 10% or more, the clad material is sufficiently softened, and hence the clad material can be easily bent. Thus, the clad material can be easily bent into the box shape including the recess portion.

In the aforementioned method for manufacturing a hermetic sealing lid member according to the second aspect, the forming of the clad material preferably includes forming the clad material in which the silver brazing layer, the first Fe layer, and a Ni layer that constitutes an outermost layer on a side opposite to the silver brazing layer and contains Ni are bonded to each other by roll-bonding the silver brazing plate, the first Fe plate, and a Ni plate that contains Ni to each other and performing the first heat treatment. When the Ni layer is provided on the exposed outermost layer, a reduction in the airtightness of the electronic component housing package using the hermetic sealing lid member can be effectively suppressed. Furthermore, when the silver brazing plate and the first Fe plate are roll-bonded to each other, the Ni plate can also be bonded concurrently, and hence a manufacturing process can be simplified as compared with the case where the Ni layer is formed separately by plating processing or the like.

An electronic component housing package according to a third aspect of the present invention includes a flat plate-shaped electronic component arrangement member on which an electronic component is arranged and a hermetic sealing lid member made of a clad material including a silver brazing layer that contains Ag and Cu and a first Fe layer bonded onto the silver brazing layer and made of Fe or an Fe alloy, and formed in a box shape including a recess portion by bending the clad material, and the hermetic sealing lid member is braze-bonded to the electronic component arrangement member by the silver brazing layer in a state where the electronic component arranged on the electronic component arrangement member is housed in the recess portion.

As hereinabove described, the electronic component housing package according to the third aspect of the present invention uses the hermetic sealing lid member according to the first aspect formed in the box shape including the recess portion, in which occurrence of both cracks and voids is suppressed, whereby insufficient hermetic sealing of the electronic component housing package caused by cracks can be suppressed. Furthermore, occurrence of voids is suppressed, and hence malfunction caused by release of atmosphere gas, residual gas, or the like that has flowed in voids of the hermetic sealing lid member at the time of braze bonding of the hermetic sealing lid member and the electronic component arrangement member to each other or after the braze bonding can be suppressed. Thus, at the time of braze bonding, splattering of a silver brazing material of the silver brazing layer can be suppressed, and hence insufficient braze bonding and adhesion of the silver brazing material to the electronic component can be suppressed. Furthermore, after the braze bonding, malfunction caused by release of the gas that has flowed in the voids into a sealed space defined by the recess portion of the hermetic sealing lid member and the flat plate-shaped electronic component arrangement member can be suppressed, and hence occurrence of a malfunction in the electronic component housed in the electronic component housing package can be suppressed.

In the aforementioned electronic component housing package according to the third aspect, the first Fe layer is preferably made of the Fe alloy that contains at least one of Co and Cr, and contains 50 mass % or more of Fe, Co, and Cr in total. According to this structure, even when softening heat treatment is performed, diffusion of Ag and Cu contained in the silver brazing layer into the first Fe layer can be suppressed. Furthermore, the first Fe layer contains 50 mass % or more of Fe, Co, and Cr in total such that diffusion of Ag and Cu contained in the silver brazing layer into the first Fe layer can be sufficiently suppressed.

In the aforementioned electronic component housing package according to the third aspect, the clad material preferably further includes an intermediate layer that is bonded onto the first Fe layer and contains at least one of Cu and Ni and a second Fe layer bonded onto the intermediate layer and made of Fe or an Fe alloy. When the first Fe layer is arranged between the intermediate layer and the silver brazing layer, diffusion of Ag and Cu contained in the silver brazing layer into the intermediate layer can be suppressed by the first Fe layer even when the softening heat treatment is performed. Furthermore, the composition and thickness of the second Fe layer made of Fe or the Fe alloy are adjusted such that the mechanical strength of the hermetic sealing lid member can be easily adjusted.

In this case, the first Fe layer preferably has a thickness of at least 1 μm and not more than a thickness of the intermediate layer. When the thickness of the first Fe layer is at least 1 μm, diffusion of Ag and Cu contained in the silver brazing layer into the intermediate layer can be sufficiently suppressed by the first Fe layer. Furthermore, the first Fe layer has the thickness of not more than the thickness of the intermediate layer such that insufficient relief of heat distortion at the time of braze bonding of the hermetic sealing lid member and the electronic component arrangement member to each other and thermal stress caused by a difference in thermal expansion after the braze bonding in the intermediate layer made of Cu can be suppressed.

In the aforementioned structure in which the clad material includes the intermediate layer and the second Fe layer, the second Fe layer of the clad material preferably has a Vickers hardness of 110 HV or more and 200 HV or less. When the Vickers hardness of the second Fe layer is 110 HV or more, easy deformation of the hermetic sealing lid member caused by an external force or the like can be suppressed. Furthermore, when the Vickers hardness of the second Fe layer is 200 HV or less, the clad material can be easily bent into the box shape including the recess portion in which the electronic component can be housed.

Effect of the Invention

According to the present invention, as hereinabove described, the hermetic sealing lid member in which occurrence of both cracks and voids is suppressed even when the clad material including the silver brazing layer is formed in the box shape including the recess portion, the method for manufacturing the hermetic sealing lid member, and the electronic component housing package including the hermetic sealing lid member can be provided.

BRIEF DESCRIPTION OF THE DRAWINGS

FIG. 7 A sectional photograph of a clad material according to Example 1 that corresponds to the first embodiment of the present invention.

FIG. 8 A sectional photograph of a clad material according to Example 2 that corresponds to the second embodiment of the present invention.

FIG. 9 A sectional photograph of a clad material according to Comparative Example 1.

FIG. 10 A sectional photograph of a clad material according to Comparative Example 2.

FIG. 11 A surface photograph of the clad material according to Comparative Example 1.

FIG. 12 A diagram for illustrating occurrence of voids and blisters.

FIG. 13 A table showing the measurement results of the mechanical strengths of the clad materials according to Example 1 and Example 2 conducted in order to confirm the effect of the present invention.

FIG. 14 A sectional photograph of the clad material according to Example 1 that corresponds to the first embodiment of the present invention after a 90 degree bend test.

FIG. 15 A sectional photograph of the clad material according to Example 2 that corresponds to the second embodiment of the present invention after a 90 degree bend test.

FIG. 16 A sectional photograph of a clad material according to Example 11 of the present invention.

FIG. 17 A sectional photograph of a clad material according to Example 12 of the present invention.

FIG. 18 A sectional photograph of a clad material according to Example 13 of the present invention.

FIG. 19 A sectional photograph of a clad material according to Example 14 of the present invention.

FIG. 20 A sectional photograph of a clad material according to Example 15 of the present invention.

FIG. 21 A sectional photograph of a clad material according to Example 16 of the present invention.

FIG. 22 A sectional photograph of a clad material according to Comparative Example 11.

FIG. 23 A sectional photograph of a clad material according to Comparative Example 12.

FIG. 24 A sectional photograph of a clad material according to Comparative Example 13.

FIG. 25 A surface photograph of the clad material according to Example 11 of the present invention.

FIG. 26 A surface photograph of the clad material according to Comparative Example 11.

FIG. 27 A surface photograph of the clad material according to Comparative Example 12.

FIG. 28 A sectional photograph of a clad material according to Example 21 of the present invention.

FIG. 29 A sectional photograph of a clad material according to Comparative Example 21.

MODES FOR CARRYING OUT THE INVENTION

Embodiments embodying the present invention are hereinafter described on the basis of the drawings.

First Embodiment

The structure of a lid member 10 according to a first embodiment of the present invention is now described with reference to FIGS. 1 to 3. The lid member 10 is an example of a "hermetic sealing lid member" in the present invention.

Figure 1:
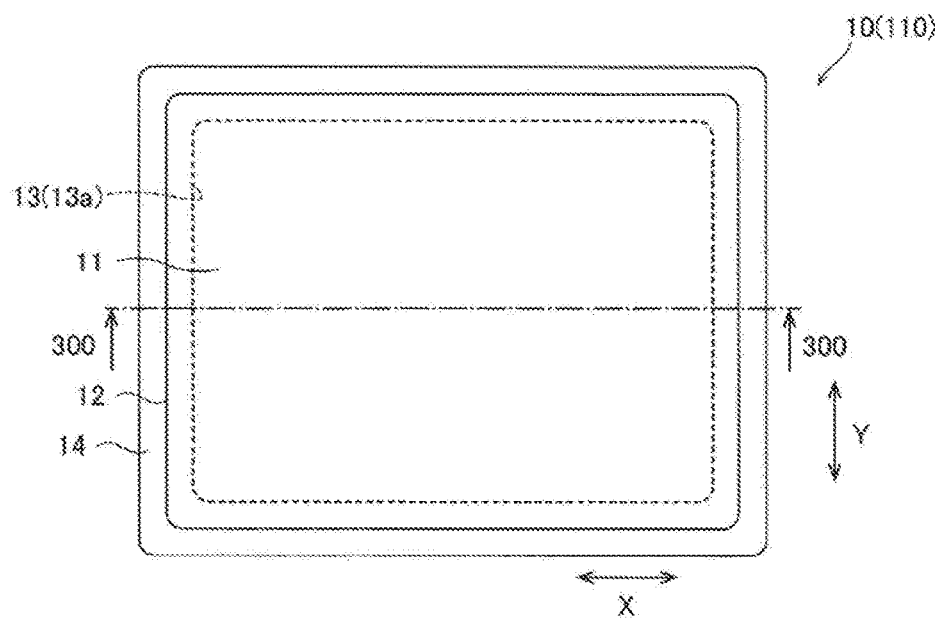
FIG. 1 A plan view showing a lid member according to first and second embodiments of the present invention.
Figure 2:
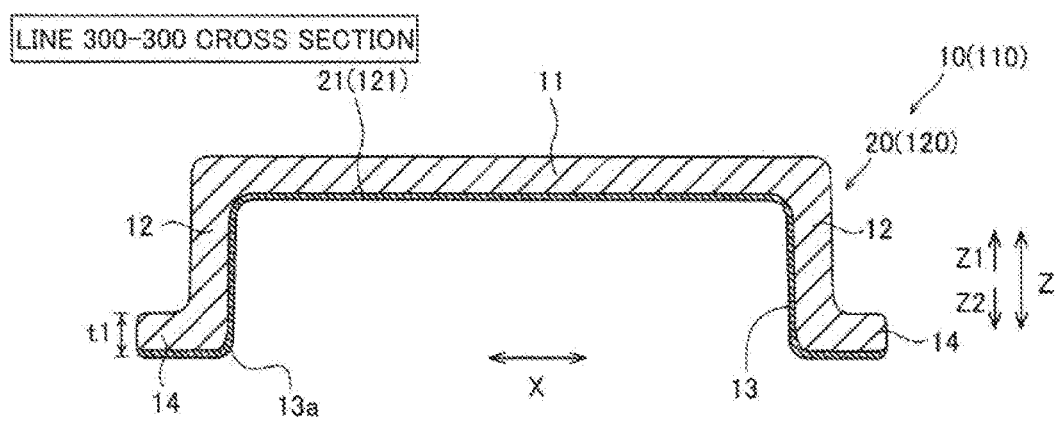
FIG. 2 A sectional view showing the lid member taken along the line 300-300 in FIG. 1.

As shown in FIG. 1, the lid member 10 according to the first embodiment of the present invention is formed in a rectangular shape, as planarly viewed from above (Z1 side; see FIG. 2). The lid member 10 includes a flat plate-shaped upper portion 11 formed to extend on an X-Y plane perpendicular to a vertical direction (direction Z) and a wall 12 formed to extend downward (Z2 side) from the entire peripheral edge of the upper portion 11, as shown in FIG. 2. Consequently, the lid member 10 is formed with a recess portion 13 surrounded by the upper portion 11 and the wall 12. This recess portion 13 has an opening 13a on the lower side. In other words, the lid member 10 is formed in a box shape including the recess portion 13.

The lid member 10 is formed with a flange 14 that extends on the X-Y plane from the side (Z2 side) of the wall 12 opposite to the upper portion 11 in a direction away from the upper portion 11. This flange 14 is formed over the entire circumference of the wall 12.

According to the first embodiment, the lid member 10 is formed in the box shape including the recess portion 13 by bending a clad material 20. This clad material 20 has a thickness t1 in the vertical direction. As shown in FIG. 3, the clad material 20 includes an overlay clad material having a five-layered structure, in which a silver brazing layer 21, an Fe layer 22, an intermediate layer 23, a base material layer 24, and a Ni layer 25 are bonded to each other in order from the lower side to the upper side in a stacked state. A base 30 (see FIG. 4) made of ceramic, described later, is arranged on the lower side of the lid member 10. FIG. 2 shows the silver brazing layer 21, and integrally shows the remaining Fe layer 22, intermediate layer 23, base material layer 24, and Ni layer 25. The Fe layer 22 is an example of a "first Fe layer" in the present invention. The base material layer 24 is an example of a "second Fe layer" in the present invention.

The silver brazing layer 21 that constitutes an outermost layer of the clad material 20 on the Z2 side (closer to the base 30) is made of a silver brazing material that contains Ag and Cu. Specifically, the silver brazing layer 21 is made of a 72Ag—Cu alloy that contains about 72 mass % of Ag, inevitable impurities, and the balance Cu or an 85Ag—Cu alloy that contains about 85 mass % of Ag, inevitable impurities, and the balance Cu, for example. The melting point of the silver brazing material is about 780° C. or more, and is higher than that of an aluminum alloy (about 600° C.), the melting point of which is the highest among low-melting-point brazing materials described in Japanese Patent Laid-Open No. 2001-156193 and lower than the melting point (about 960° C.) of pure Ag. The silver brazing layer 21 has a thickness t2 in the vertical direction.

The silver brazing layer 21 constitutes the outermost layer of the clad material 20 closer to the base 30 such that the silver brazing layer 21 is exposed on the entire surface of the lid member 10 including the flange 14 on the Z2 side.

The Fe layer 22 bonded to the silver brazing layer 21 and the intermediate layer 23 (onto the silver brazing layer 21) is made of an Fe alloy that contains pure Fe or Fe, such as SPCC (cold rolled steel sheet defined in JIS G 3141). When the Fe layer 22 is made of the Fe alloy, an Fe alloy that contains at least one of Co and Cr and contains about 50 mass % or more of Fe, Co, and Cr in total is preferably used. The Fe layer 22 may be made of an Fe alloy that contains more than 0 mass % and not more than about 50 mass % of Ni.

Fe, Co, and Cr have properties not allowing formation of solid solution with Ag and Cu in a temperature environment of about 650° C. or more and the melting point (about 960° C.) of pure Ag or less. In other words, diffusion of Ag and Cu into the Fe layer 22 made of pure Fe or the Fe layer 22 made of the Fe alloy that contains Fe and at least one of Co and Cr is suppressed. The Fe layer 22 has a thickness t3 in the vertical direction. This thickness t3 is preferably 1 μm or more.

The intermediate layer 23 bonded to the Fe layer 22 and the base material layer 24 (onto the Fe layer 22) is made of so-called pure Cu such as oxygen-free copper. Thus, the intermediate layer 23 can be made of metal more flexible than the base material layer 24 made of Fe or an Fe alloy. The intermediate layer 23 has a thickness t4 in the vertical direction. The thickness t4 is preferably equal to or more than the thickness t3 of the Fe layer 22. In other words, the thickness t3 of the Fe layer 22 is preferably at least 1 μm and not more than the thickness t4.

When the intermediate layer 23 is made of Cu, the intermediate layer 23 easily forms solid solution with Ag contained in the silver brazing layer 21 under a temperature condition of about 650° C. or more. However, diffusion of Ag and Cu contained in the silver brazing layer 21 into the intermediate layer 23 is suppressed by the Fe layer 22 bonded to the silver brazing layer 21 and the intermediate layer 23. Consequently, formation of voids on an interface Ia between the silver brazing layer 21 and the Fe layer 22 directly bonded to the silver brazing layer 21 is suppressed.

The base material layer 24 bonded to the intermediate layer 23 and the Ni layer 25 (onto the intermediate layer 23) is a layer that mainly determines parameters such as the mechanical strength and thermal expansion coefficient of the clad material 20. The base material layer 24 is made of an Fe alloy that contains pure Fe or Fe. As the Fe alloy of which the base material layer 24 is made, an Fe alloy having a small thermal expansion coefficient, such as a 29Ni-17Co—Fe alloy (so-called kovar (registered trademark)) that contains about 29 mass % of Ni, about 17 mass % of Co, inevitable impurities, and the balance Fe or a 42Ni-6Cr—Fe alloy that contains about 42 mass % of Ni, about 6 mass % of Cr, inevitable impurities, and the balance Fe, is preferably used. Thus, when the lid member 10 is braze-bonded to the base 30, a difference in thermal expansion between the base 30 made of ceramic having a small thermal expansion coefficient and the base material layer 24 of the lid member 10 can be reduced. Consequently, braze bonding separation or the like due to the difference in terminal expansion between the base 30 and the base material layer 24 (lid member 10) can be suppressed. The Fe alloy having a small thermal expansion coefficient includes an Fe alloy that contains about 29 mass % or more of Ni, for example.

The Fe layer 22 and the base material layer 24 are preferably made of a material having the same composition of Fe or the Fe alloy. Thus, the mechanical properties of the Fe layer 22 and the base material layer 24 can be matched with each other, and hence the mechanical properties of the clad material 20 can be easily adjusted.

The base material layer 24 has a thickness t5 in the vertical direction. The thickness t5 is preferably more than the thickness t3 of the Fe layer 22 and more preferably more than the thickness of each of the silver brazing layer 21, the Fe layer 22, the intermediate layer 23, and the Ni layer 25. The thickness t5 is still more preferably about 50% or more of the thickness t1 of the clad material 20.

The base material layer 24 has a Vickers hardness of about 110 HV or more and about 200 HV or less. The base material layer 24 preferably has a Vickers hardness of about 150 HV or more and about 170 HV or less.

The Ni layer 25 that constitutes an outermost layer of the clad material 20 on the Z1 side (opposite to the base 30) is made of pure Ni unlikely to potentially corrode. The Ni layer 25 has a thickness t6 in the vertical direction. The thickness t6 is preferably sufficiently small, which is about 2 μm, for example.

The clad material 20 has an elongation (a rate of fracture elongation) of about 10% or more in a tensile test defined in the JIS standards. The elongation (%) is determined by ((the length of a test material at the time of fracture−the length of the test material before the test (before tension))/the length of the test material before the test)×100.

The structure of a package 100 using the lid member 10 according to the first embodiment of the present invention is now described with reference to FIG. 4. The package 100 is an example of an "electronic component housing package" in the present invention.

The package 100 according to the first embodiment of the present invention includes the lid member 10 and the flat plate-shaped base 30 to which the lid member 10 is braze-bonded on the lower side (Z2 side) of the lid member 10. FIG. 4 shows the silver brazing layer 21 of the lid member 10, and integrally shows the remaining Fe layer 22, intermediate layer 23, base material layer 24, and Ni layer 25 (see FIG. 3) without showing the same individually.

The base 30 is made of ceramic such as alumina, and is formed in a flat plate shape on the X-Y plane. An electronic component 40 such as a crystal unit is mounted on the upper surface 30a of the base 30 through a bump 50. The lid member 10 is arranged on the upper surface 30a of the base 30 such that the electronic component 40 is housed in the recess portion 13. The lid member 10 is arranged such that the silver brazing layer 21 side is closer to the base 30 (lower side). Consequently, the lower surface of the silver brazing layer 21 provided on the flange 14 of the lid member 10 is in contact with the upper surface 30a of the base 30. The base 30 is an example of an "electronic component arrangement member" in the present invention.

The substantially entire surface of the silver brazing layer 21 provided on the flange 14 of the lid member 10 is melted such that the lid member 10 and the base 30 are braze-bonded to each other. Thus, the package 100 is sealed such that a sealed space S defined by the recess portion 13 of the lid member 10 and the base 30 is in a hermetic state in a state where the electronic component 40 is housed in the sealed space S. A metalization layer in which a W layer, a Ni layer, and a Au layer are stacked in this order may be provided on a frame-shaped region, on which the flange 14 is arranged, of the upper surface 30a of the base 30. This metalization layer can improve adhesion between the melted silver brazing layer 21 and the base 30.

A process for manufacturing the lid member 10 according to the first embodiment of the present invention and a process for manufacturing the package 100 using the lid member 10 are now described with reference to FIGS. 2 to 5.

First, a plate material of a silver brazing material that contains Ag and Cu (silver brazing plate), a plate material made of an Fe alloy that contains pure Fe or Fe (first Fe plate), a pure Cu plate material (plate for the intermediate layer), a plate made of an Fe alloy that contains pure Fe or Fe (second Fe plate), and a pure Ni plate material (Ni plate) are prepared, and are stacked in this order. At this time, each of the plate materials is prepared such that the ratios of the thicknesses of the plate materials correspond to the ratios of the thicknesses of the layers (the silver brazing layer 21, the Fe layer 22, the intermediate layer 23, the base material layer 24, and the Ni layer 25) of the clad material 20, respectively.

Figure 3:
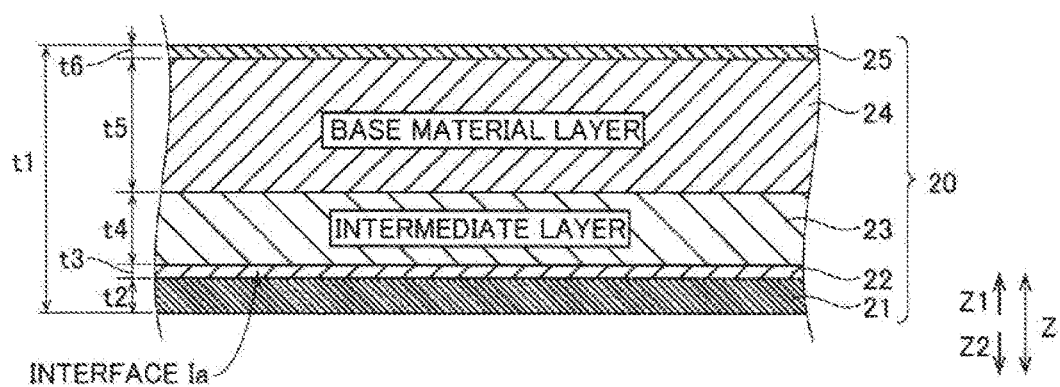
FIG. 3 An enlarged sectional view showing the layer structure of the lid member according to the first embodiment of the present invention.

Then, in a state where the five plate materials are stacked in a thickness direction, heat treatment at the time of rolling for diffusion annealing and rolling for roll bonding are alternately repeated until the thickness of the clad material 20 reaches t1 (see FIG. 3). This heat treatment at the time of rolling is heat treatment performed to relieve hardening caused by rolling of metal layers and to clad-bond the metal layers to each other. Specifically, the heat treatment at the time of rolling is performed for several 10 seconds or more and about 10 minutes or less in a temperature environment of about 600° C. or more and about 700° C. or less. The heat treatment at the time of rolling is an example of "first heat treatment" in the present invention. The rolling for roll bonding is performed at a predetermined rolling reduction.

Thus, the clad material 20 of a continuous body, in which metal of which the silver brazing layer 21, the Fe layer 22, the intermediate layer 23, the base material layer 24, and the Ni layer 25 adjacent in the stacked state are made is clad-bonded to each other, is prepared with a thickness t1.

Then, the clad material 20 of a continuous body is punched in a rectangular shape having a predetermined size by pressing such that the flat plate-shaped clad material 20 is prepared. Then, heat treatment (softening heat treatment) is performed to soften the flat plate-shaped clad material 20 to an extent that allows the clad material 20 to be easily formed into a box shape. This softening heat treatment is performed in an environment of at least a temperature allowing softening of the base material layer 24 and a temperature lower than the melting point of the silver brazing material of which the silver brazing layer 21 is made. Specifically, the softening heat treatment is performed for about 3 minutes in a temperature environment of at least about 700° C. and less than the melting point of the silver brazing material. The time of the heat treatment to be performed in the temperature environment of at least about 700° C. and less than the melting point of the silver brazing material may be adjusted properly depending on the material composition of the clad material 20 or the like. The softening heat treatment is an example of "second heat treatment" in the present invention.

Even in a temperature environment of at least about 650° C. and less than about 700° C. that is a temperature environment of less than about 700° C., the base material layer 24 can be softened by performing the softening heat treatment for a longer time than the treatment time (about 10 minutes or less) of the heat treatment at the time of rolling. Specifically, the softening heat treatment may be performed for about 30 minutes or more in a temperature environment of at least about 650° C. and less than about 700° C. The time of heat treatment to be performed in the temperature environment of at least about 650° C. and less than about 700° C. may be adjusted properly depending on the material composition of the clad material 20 or the like so far as the same is longer than about 10 minutes.

Figure 5:
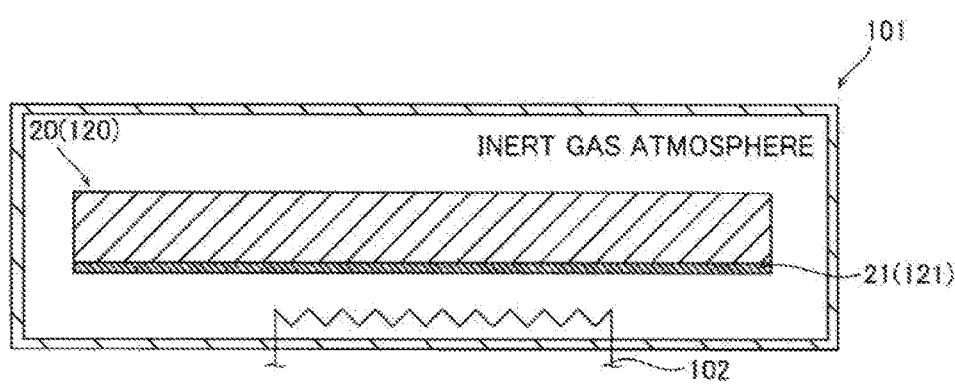
FIG. 5 A diagram for illustrating softening heat treatment on a clad material according to the first embodiment of the present invention.

In the softening heat treatment, an inert gas atmosphere such as a hydrogen ($H_2$) atmosphere or a nitrogen ($N_2$) atmosphere is generated inside a predetermined heating furnace 101 in a state where the flat plate-shaped clad material 20 is arranged in the heating furnace 101, as shown in FIG. 5. Then, the inside of the heating furnace is heated by a heat source 102 such as a resistance heating element. FIG. 5 shows the silver brazing layer 21 of the clad material 20, and integrally shows the remaining Fe layer 22, intermediate layer 23, base material layer 24, and Ni layer 25 (see FIG. 3) without showing the same individually.

Although Ag and Cu contained in the silver brazing layer 21 are likely to be diffused by heating the silver brazing layer 21 by the softening heat treatment, diffusion of Ag and Cu into another layer such as the intermediate layer 23 is suppressed by forming the Fe layer 22. Consequently, a reduction in Ag and Cu contained in the silver brazing layer 21 is suppressed such that occurrence of voids on the interface Ia (see FIG. 3) between the silver brazing layer 21 and the Fe layer 22 directly bonded to the silver brazing layer 21 is suppressed. Furthermore, the clad material 20 is reformed to be easily plastic-deformed by the softening heat treatment. Specifically, the clad material 20 is reformed by the softening heat treatment such that the Vickers hardness of the base material layer 24 is reduced to about 110 HV or more and about 200 HV or less, and the rate of elongation of the clad material 20 is about 10% or more.

Then, the flat plate-shaped clad material 20 is bent by an unshown pressing machine. At this time, the softening heat treatment is performed such that the clad material 20 is reformed to be easily plastic-deformed, and hence occurrence of cracks on a bent portion etc. is suppressed. Thus, the lid member 10 having the box shape including the recess portion 13 as shown in FIG. 2 is prepared.

Figure 4:
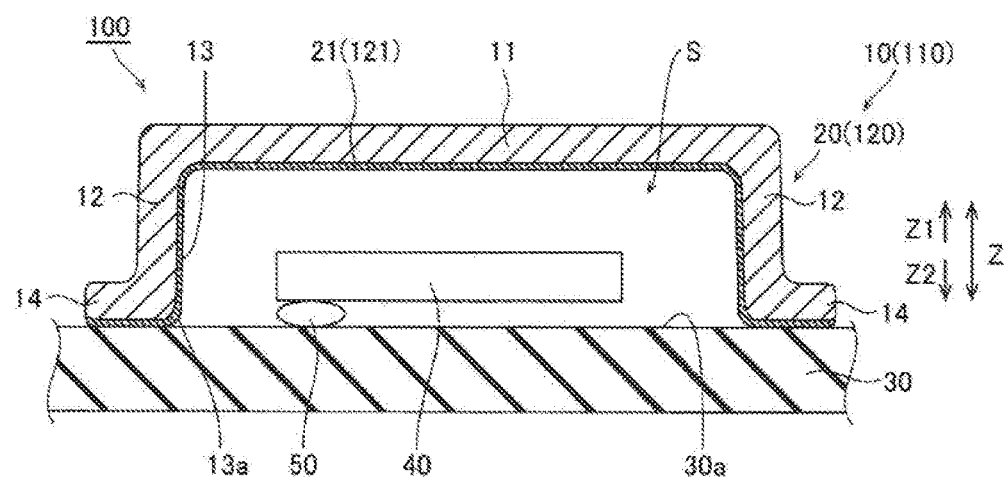
FIG. 4 A sectional view showing an electronic component housing package using the lid member according to the first and second embodiments of the present invention.

As shown in FIG. 4, the flat plate-shaped base 30 in which the electronic component 40 is bonded onto the upper surface 30a through the bump 50 is prepared. Then, the silver brazing material of the silver brazing layer 21 is melted at a temperature of about 780° C. or more in a state where the flange 14 of the lid member 10 is arranged on the upper surface 30a of the base 30 to surround the electronic component 40. At this time, the silver brazing material is melted by seam welding, laser welding, or the like. Thus, the box-shaped lid member 10 and the flat plate-shaped base 30 are braze-bonded to each other to manufacture the package 100.

When the seam welding is performed, the lid member 10 and the base 30 are welded to each other in a state where an unshown roller electrode is in contact with the Ni layer 25 (see FIG. 2). At this time, occurrence of spark between the roller electrode and the lid member 10 at the time of seam welding can be suppressed by the Ni layer 25 having a low electrical resistance.

Furthermore, occurrence of voids in the lid member 10 is suppressed, and hence almost no malfunction caused by flowing of gas in voids occurs. For example, splattering of the silver brazing material of the silver brazing layer 21 is suppressed at the time of braze bonding, and release of gas taken in blisters into the sealed space S of the package 100 is suppressed after the braze bonding. Thus, when the electronic component 40 in the sealed space S is a crystal unit, a variation (degradation) in the frequency characteristics of the crystal unit is suppressed.

According to the first embodiment, the following effects can be obtained.

According to the first embodiment, as hereinabove described, the clad material 20 is provided with the Fe layer 22 bonded onto the silver brazing layer 21 and made of Fe or the Fe alloy such that diffusion of Ag and Cu contained in the silver brazing layer 21 into the Fe layer 22 and the intermediate layer 23 can be suppressed even when the softening heat treatment is performed. Thus, even when the softening heat treatment is performed, a reduction in the silver brazing material located in the vicinity of the interface Ia between the silver brazing layer 21 and the Fe layer 22 directly bonded to the silver brazing layer 21 caused by diffusion of the silver brazing material can be suppressed, and hence occurrence of voids on the interface Ia can be suppressed. Thus, the softened clad material 20 can be bent, and hence occurrence of cracks on the bent portion can be suppressed. Consequently, when the clad material 20 including the silver brazing layer 21 is formed in the box shape including the recess portion 13, occurrence of cracks can be suppressed.

Thus, insufficient hermetic sealing of the package 100 caused by cracks can be suppressed. Furthermore, occurrence of voids is suppressed, and hence malfunction caused by release of atmosphere gas, residual gas, or the like that has flowed in voids of the lid member 10 at the time of braze bonding of the lid member 10 and the base 30 to each other or after the braze bonding can be suppressed. Thus, at the time of braze bonding, splattering of the silver brazing material of the silver brazing layer 21 can be suppressed. Consequently, insufficient braze bonding and adhesion of the silver brazing material to the electronic component 40 can be suppressed. Furthermore, after the braze bonding, malfunction caused by release of the gas that has flowed in the voids into the sealed space S defined by the recess portion 13 of the lid member 10 and the flat plate-shaped base 30 can be suppressed, and hence occurrence of a malfunction in the electronic component 40 housed in the package 100 can be suppressed.

According to the first embodiment, the Fe layer 22 is made of the Fe alloy that contains at least one of Co and Cr and contains about 50 mass % or more of Fe, Co, and Cr in total. According to this structure, even when the softening heat treatment is performed, Ag and Cu contained in the silver brazing layer 21 are hardly solid-dissolved in the Fe layer 22 made of the Fe alloy that contains at least one of Co and Cr such that diffusion of Ag and Cu contained in the silver brazing layer 21 into the Fe layer 22 and the intermediate layer 23 can be suppressed. Furthermore, the Fe layer 22 contains about 50 mass % or more of Fe, Co, and Cr in total such that diffusion of Ag and Cu contained in the silver brazing layer 21 into the Fe layer 22 and the intermediate layer 23 can be sufficiently suppressed.

According to the first embodiment, the clad material 20 is further formed with the intermediate layer 23 bonded onto the Fe layer 22 and made of pure Cu and the base material layer 24 bonded onto the intermediate layer 23 and made of Fe or the Fe alloy. Thus, the Fe layer 22 is arranged between the intermediate layer 23 and the silver brazing layer 21 such that diffusion of Ag and Cu contained in the silver brazing layer 21 into the intermediate layer 23 can be suppressed by the Fe layer 22 even when the softening heat treatment is performed. Furthermore, the intermediate layer 23 is made of pure Cu such that the intermediate layer 23 can be softened to some extent, and hence heat distortion at the time of braze bonding of the base material layer 24 and the base 30 to each other and thermal stress caused by a difference in thermal expansion after the braze bonding can be relieved in the intermediate layer 23. In addition, the composition and thickness of the base material layer 24 made of Fe or the Fe alloy are adjusted such that the mechanical strength of the lid member 10 can be easily adjusted.

According to the first embodiment, the thickness t3 of the Fe layer 22 is set to about 1 μm or more such that the thickness t3 of the Fe layer 22 can be sufficiently ensured, and hence diffusion of Ag and Cu contained in the silver brazing layer 21 into the intermediate layer 23 can be sufficiently suppressed by the Fe layer 22. Furthermore, the thickness t3 of the Fe layer 22 is set to be not more than the thickness t4 of the intermediate layer 23 such that an excessive increase in the thickness t3 of the Fe layer 22 can be suppressed, and hence insufficient relief of heat distortion at the time of braze bonding of the base material layer 24 and the base 30 to each other and thermal stress caused by a difference in thermal expansion after the braze bonding in the intermediate layer 23 made of pure Cu can be suppressed.

According to the first embodiment, the base material layer 24 of the clad material 20 has a Vickers hardness of about 200 HV or less such that the base material layer 24 is sufficiently softened, and hence the clad material 20 including the base material layer 24 can be easily bent to have the box shape including the recess portion 13 in which the electronic component 40 can be housed. Furthermore, the base material layer 24 has a Vickers hardness of 110 HV or more such that the hardness of the base material layer 24 is not excessively small, and hence easy deformation of the lid member 10 caused by an external force or the like can be suppressed.

According to the first embodiment, the thickness t5 of the base material layer 24 of the clad material 20 is set to about 50% or more of the thickness t1 of the clad material 20. Thus, the parameters such as the mechanical strength and thermal expansion coefficient of the clad material 20 can be mainly determined by the base material layer 24, and hence materials (various elements to be added other than Fe) for the base material layer 24 are properly selected such that the lid member 10 excellent in airtightness or the like can be prepared.

According to the first embodiment, the Fe layer 22 is made of the Fe alloy that contains Ni such that the thermal expansion coefficient of the Fe layer 22 can be reduced. Thus, the thermal expansion coefficient of the clad material 20 can be reduced, and hence a large difference in thermal expansion between the base 30 made of ceramic having a small thermal expansion coefficient and the lid member 10 can be suppressed. Furthermore, the Fe layer 22 is made of the Fe alloy that contains not more than about 50 mass % of Ni such that easy diffusion of Ag and Cu contained in the silver brazing layer 21 into the Fe layer 22 can be suppressed.

According to the first embodiment, the clad material 20 has a rate of elongation of about 10% or more such that the clad material 20 is sufficiently softened, and hence the clad material 30 can be easily bent. Thus, the clad material 20 can be easily bent into the box shape including the recess portion 13.

According to the first embodiment, the Ni layer 25 is provided on the exposed outermost layer of the clad material 20 such that the corrosion resistance of the exposed surface of the clad material 20 can be improved by the Ni layer 25. Thus, a reduction in the airtightness of the package 100 using the lid member 10 caused by corrosion of the lid member 10 can be effectively suppressed.

In the manufacturing method according to the first embodiment, the softening heat treatment is performed at a temperature of at least about 700° C. and less than the melting point of the silver brazing layer 21 as the softening heat treatment for softening the clad material 20. According to this structure, the softening heat treatment can be performed at a sufficiently high temperature that does not allow melting of the silver brazing layer 21, and hence the clad material 20 can be sufficiently softened. On the other hand, even at a temperature of at least about 650° C. and less than about 700° C., the softening heat treatment is performed for a longer time than the time of the heat treatment at the time of rolling. Also according to this structure, the clad material 20 can be softened to an extent that allows the clad material 20 to be formed into the box shape including the recess portion 13. Thus, occurrence of cracks on the clad material 20 in bending can be effectively suppressed.

In the manufacturing method according to the first embodiment, the Ni plate can also be bonded concurrently when the silver brazing plate, the first Fe plate, the plate for the intermediate layer, and the second Fe plate are roll-bonded to each other, and hence the manufacturing process can be simplified as compared with the case where the Ni layer 25 is formed separately by plating processing or the like.

Second Embodiment

The structure of a lid member 110 according to a second embodiment of the present invention is now described with reference to FIGS. 1, 2, 4, and 6.

The lid member 110 according to the second embodiment of the present invention has an appearance shape similar to that of the lid member 10 according to the aforementioned first embodiment, as shown in FIGS. 1 and 2.

Figure 6:
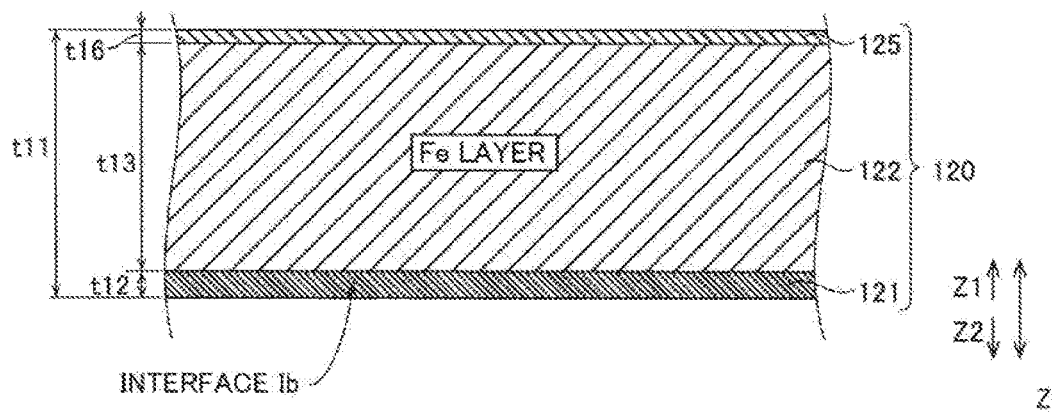
FIG. 6 An enlarged sectional view showing the layer structure of the lid member according to the second embodiment of the present invention.

According to the second embodiment, the lid member 110 is formed in a box shape including a recess portion 13 by bending a clad material 120, as shown in FIG. 2. This clad material 120 has a thickness t11 in a vertical direction. As shown in FIG. 6, the clad material 120 includes an overlay clad material having a three-layered structure, in which a silver brazing layer 121, an Fe layer 122, and a Ni layer 125 are bonded to each other in order from the lower side (closer to a base 30 (see FIG. 4)) to the upper side in a stacked state. FIGS. 2, 4, and 5 shows the silver brazing layer 121 of the clad material 120, and integrally shows the remaining Fe layer 122 and Ni layer 125 (see FIG. 6) without showing the same individually. The Fe layer 122 is an example of a "first Fe layer" in the present invention.

The silver brazing layer 121 that constitutes an outermost layer of the clad material 120 closer to the base 30 (Z2 side) has a composition and a structure similar to those of the silver brazing layer 21 according to the aforementioned first embodiment. The silver brazing layer 121 has a thickness t12 in the vertical direction.

The Fe layer 122 bonded to the silver brazing layer 121 and the Ni layer 125 (onto the silver brazing layer 121) is made of pure Fe or an Fe alloy, similarly to the Fe layer 22 and the base material layer 24 according to the aforementioned first embodiment. The Fe layer 122 has a thickness t13 in the vertical direction. The thickness t13 is preferably larger than the thickness t12 of the silver brazing layer 21. The thickness t13 is more preferably about 50% or more of the thickness t11 of the clad material 120 and still more preferably about 80% or more of the thickness t11. At this time, the Fe layer 122 is preferably made of an Fe alloy that contains Ni and has a small thermal expansion coefficient. Thus, a difference in thermal expansion between the base 30 (see FIG. 4) and the Fe layer 122 of the lid member 110 can be reduced. Furthermore, formation of voids on an interface Ib (see FIG. 6) between the silver brazing layer 121 and the Fe layer 122 directly bonded to the silver brazing layer 121 is suppressed.

The Ni layer 125 that constitutes an outermost layer of the clad material 120 on a side (Z1 side) opposite to the base 30 has a composition and a structure similar to those of the Ni layer 25 according to the aforementioned first embodiment. The Ni layer 125 has a thickness t16 in the vertical direction.

The clad material 120 has an elongation (a rate of fracture elongation) of about 10% or more in a tensile test defined in the JIS standards.

The structure of a package 100 using the lid member 110 is substantially similar to that according to the aforementioned first embodiment, as shown in FIG. 4. A process for manufacturing the lid member 110 is substantially similar to that according to the aforementioned first embodiment except that a plate material of a silver brazing material that contains Ag and Cu, a plate material made of an Fe alloy that contains pure Fe or Fe, and a pure Ni plate material are prepared, are stacked in this order, and are roll-bonded to each other.

According to the second embodiment, the following effects can be obtained.

According to the second embodiment, as hereinabove described, the clad material 120 is provided with the Fe layer 122 bonded onto the silver brazing layer 121 and made of Fe or the Fe alloy such that occurrence of voids in the clad material 120 including the silver brazing layer 121 can be suppressed, and occurrence of cracks can be suppressed when the clad material 120 is formed in the box shape including the recess portion 13, similarly to the first embodiment.

According to the second embodiment, the lid member 110 is made of the three-layered clad material 120 in which the silver brazing layer 121, the Fe layer 122, and the Ni layer 125 are bonded to each other in the stacked state such that the layer structure of the clad material 120 is simplified as compared with the five-layered clad material 20 including the intermediate layer 23 and the base material layer 24 according to the first embodiment. Thus, when the clad material 120 is prepared, the cost can be reduced by reducing the number of types of metal plates, and the number of layers in the structure is reduced such that the clad material 120 can be easily prepared. The remaining effects according to the second embodiment are similar to those of the first embodiment except for the effects caused by the intermediate layer 23 and the base material layer 24.

EXAMPLES

Observation of the clad materials that correspond to the first embodiment and the second embodiment and measurement of the mechanical strengths thereof, and observation of a two-layered clad material of a silver brazing layer and a predetermined metal layer, which have been conducted in order to confirm the effect of the present invention, are now described with reference to FIGS. 3 and 6 to 29.

Observation of Clad Materials that Correspond to First Embodiment and Second Embodiment First, as Example 1 that corresponds to the aforementioned first embodiment, the flat plate-shaped five-layered clad material 20 in which the silver brazing layer 21, the Fe layer 22, the intermediate layer 23, the base material layer 24, and the Ni layer 25 adjacent in the stacked state were clad-bonded to each other, as shown in FIG. 3 was prepared. At this time, the silver brazing layer 21 was made of a 72Ag—Cu alloy. Both the Fe layer 22 and the base material layer 24 were made of a 29Ni-17Co—Fe alloy. The intermediate layer 23 was made of pure Cu. The Ni layer 25 was made of pure Ni.

Furthermore, in Example 1, the thickness t1 of the clad material 20 was set to 90 μm. The thickness t2 of the silver brazing layer 21 was set to 13 μm. The thickness t3 of the Fe layer 22 was set to 4 μm. The thickness t4 of the intermediate layer 23 was set to 24 μm. The thickness t5 of the base material layer 24 was set to 45 μm. The thickness t6 of the Ni layer 25 was set to 4 μm.

Then, heat treatment (softening heat treatment) for softening was performed on the clad material 20 according to Example 1. Specifically, the softening heat treatment was performed for 3 minutes in a nitrogen atmosphere and a temperature environment of 700° C.

As Example 2 that corresponds to the aforementioned second embodiment, the flat plate-shaped three-layered clad material 120 in which the silver brazing layer 121, the Fe layer 122, and the Ni layer 125 adjacent in the stacked state were clad-bonded to each other, as shown in FIG. 6 was prepared. At this time, the silver brazing layer 121 was made of a 72Ag—Cu alloy. The Fe layer 122 was made of a 29Ni-17Co—Fe alloy. The Ni layer 125 was made of pure Ni.

Furthermore, in Example 2, the thickness t11 of the clad material 120 was set to 84 μm. The thickness t12 of the silver brazing layer 121 was set to 10 μm. The thickness t13 of the Fe layer 122 was set to 70 μm. The thickness t16 of the Ni layer 125 was set to 4 μm. Then, softening heat treatment was performed on the clad material 120 according to Example 2 in conditions similar to Example 1 as described above.

On the other hand, as Comparative Examples, a clad material provided with no Fe layer between a silver brazing layer and an intermediate layer was prepared. Specifically, as Comparative Example 1, the flat plate-shaped four-layered clad material in which the silver brazing layer, the intermediate layer, a base material layer, and a Ni layer were stacked in this order was prepared. The clad material according to Comparative Example 1 is the same as the clad material 20 according to Example 1 except that no Fe layer is provided.

As Comparative Example 2, the flat plate-shaped four-layered clad material in which an intermediate layer made of pure Ni was used instead of the intermediate layer made of pure Cu according to Comparative Example 1 was prepared. The clad material according to Comparative Example 2 is the same as the clad material 20 according to Example 1 except that no Fe layer is provided and the intermediate layer is made of pure Ni.

In each of Comparative Examples 1 and 2, no Fe layer was provided, and hence the thickness of the clad material was set to 86 μm, and the thicknesses of the remaining metal layers were set to the same thicknesses as Example 1. Then, softening heat treatment was performed on the clad materials according to Comparative Examples 1 and 2 in conditions similar to Example 1 as described above.

Then, the cross sections of the flat plate-shaped clad materials according to Examples and Comparative Examples after the softening heat treatment were observed with a scanning electron microscope to check the presence or absence of voids.

Furthermore, a surface of the clad material according to Comparative Example 1 on which the softening heat treatment was performed for 3 minutes in a hydrogen atmosphere and a temperature environment of 700° C. was observed with the scanning electron microscope to observe blisters caused by coarsening of voids.

In sectional photographs of the clad materials according to Examples 1 and 2 shown in FIGS. 7 and 8, no void was observed on an interface between the silver brazing layer and the Fe layer directly bonded to the silver brazing layer. In Examples 1 and 2, no blister was observed on a surface of the clad material closer to the silver brazing layer. On the other hand, in sectional photographs of the clad materials according to Comparative Examples 1 and 2 shown in FIGS. 9 and 10, voids were observed on an interface between the silver brazing layer and the intermediate layer directly bonded to the silver brazing layer. In a surface photograph of the clad material according to Comparative Example 1 as shown in FIG. 13, a plurality of blisters was observed on a surface of the clad material closer to the silver brazing layer. Also in Comparative Example 2, blisters were observed on a surface of the clad material closer to the silver brazing layer.

These voids and blisters formed in Comparative Examples 1 and 2 are conceivably explained by a mechanism shown in FIG. 12. In other words, according to Comparative Example 1, the speed of diffusion of Ag of the silver brazing layer into the intermediate layer (Cu) is larger than the speed of diffusion of Cu of the intermediate layer into the silver brazing layer in the softening heat treatment, and hence a larger amount of Ag of the silver brazing layer in the vicinity of the interface is diffused (solid solution diffused) into the intermediate layer. Consequently, a component of the interface of the silver brazing layer was reduced such that the voids (Kirkendall voids) were conceivably formed on the side of the interface closer to the silver brazing layer. According to Comparative Example 2, the speed of diffusion of Cu of the silver brazing layer into the intermediate layer (Ni) is larger than the speed of diffusion of Ni of the intermediate layer into the silver brazing layer in the softening heat treatment, and hence a larger amount of Cu of the silver brazing layer in the vicinity of the interface is diffused (solid solution diffused) into the intermediate layer. Consequently, a component of the interface of the silver brazing layer was reduced such that the voids were conceivably formed on the side of the interface closer to the silver brazing layer. Atmosphere gas (nitrogen or hydrogen) that has passes through the silver brazing layer or gas contained in the silver brazing layer and the intermediate layer is taken in the voids such that the voids coarsen and push up the silver brazing layer. Thus, the blisters conceivably emerged on the surface of the clad material.

On the other hand, when an Fe layer was provided as in Examples 1 and 2, diffusion of Ag and Cu of the silver brazing layer was suppressed by the Fe layer containing Fe and Co in which Ag and Cu were hardly solid-dissolved, and hence no void was conceivably observed.

(Measurement of Mechanical Strengths of Clad Materials that Correspond to First Embodiment and Second Embodiment)

Next, the mechanical strength of each of the flat plate-shaped clad materials according to Examples 1 and 2 after the softening heat treatment was measured. Specifically, a tensile test based on the JIS standards was performed such that elongations (fracture elongations) in Examples 1 and 2 were measured. A Vickers hardness test based on the JIS standards was performed such that the Vickers hardness of each of the base material layer 24 and the Fe layer 122 both made of a 29Ni-17Co—Fe alloy was measured.

Furthermore, a 90 degree bend test was performed on the clad materials according to Examples 1 and 2. At this time, in each of the case where the clad materials according to Examples 1 and 2 were bent such that the silver brazing layer 21 (121) side was convex (the Ni layer 25 (125) side was concave) and the case where the clad materials according to Examples 1 and 2 were bent such that the Ni layer 25 (125) side was convex (the silver brazing layer 21 (121) side was concave), the cross sections of the clad materials were observed with the scanning electron microscope.

From the test results shown in FIG. 13, the elongations of both the clad materials according to Examples 1 and 2 were increased to 10% or more, and the Vickers hardness of each of the base material layer 24 and the Fe layer 122 made of the 29Ni-17Co—Fe alloy was reduced to 200 HV or less. The elongations of the clad materials before the softening heat treatment are about 5%, and the Vickers hardness of the 29Ni-17Co—Fe alloy is about 220 HV. Thus, it has been confirmed that each of the clad materials according to Examples 1 and 2 was sufficiently softened to have at least an elongation and a Vickers hardness corresponding to those of a semi-hard material from a hard material. In each of the clad materials according to Examples 1 and 2, the elongation was increased to 20% or more, and the Vickers hardness of the 29Ni-17Co—Fe alloy was reduced to 160 HV or less such that each of the clad materials according to Examples 1 and 2 became a soft material further softened than a semi-hard material. Consequently, it is believed that the clad materials according to Examples 1 and 2 can be easily bent while occurrence of cracks is suppressed.

From the results of the 90 degree bend test shown in FIGS. 14 and 15, in both of the case where the clad materials according to Examples 1 and 2 were bent such that the silver brazing layer 21 (121) side was convex and the case where the clad materials according to Examples 1 and 2 were bent such that the Ni layer 25 (125) side was convex, no crack was observed. From this, it has been confirmable that even when the clad materials according to Examples 1 and 2 are actually bent, occurrence of cracks on the clad materials according to Examples 1 and 2 can be suppressed.

(Observation of Cross Section of Two-Layered Clad Material)

Next, two-layered clad materials including Fe layers having different compositions and silver brazing layers made of a 72Ag—Cu alloy or an 85Ag—Cu alloy were prepared as Examples. As Comparative Examples, two-layered clad materials including metal layers containing no Fe but containing at least one of Cu and Ni and silver brazing layers made of a 72Ag—Cu alloy or an 85Ag—Cu alloy were prepared. The thickness of each of the silver brazing layers was set to 10 µm, and the thickness of each of the Fe layers (metal layers) was set to 75 µm.

Specifically, as Example 11, a clad material made of a 72Ag—Cu alloy (silver brazing layer) and pure Fe (Fe layer) made of SPCC was prepared. As Example 12, a clad material made of a 72Ag—Cu alloy and a 29Ni-17Co Fe alloy was prepared. As Example 13, a clad material made of a 72Ag—Cu alloy and a 36Ni—Fe alloy (so-called inver (registered trademark)) containing 36 mass % of Ni, the balance Fe, and inevitable impurities was prepared. As Example 14, a clad material made of a 72Ag—Cu alloy and a 50Ni—Fe alloy containing 50 mass % of Ni, the balance Fe, and inevitable impurities was prepared. As Example 15, a clad material made of a 72Ag—Cu alloy and a 42Ni-6Cr—Fe alloy containing 42 mass % of Ni, 6 mass % of Cr, the balance Fe, and inevitable impurities was prepared. As Example 16, a clad material made of a 72Ag—Cu alloy and an 18Cr—Fe alloy containing 18 mass % of Cr, the balance Fe, and inevitable impurities was prepared. As Example 21, a clad material made of an 85 g-Cu alloy and a 29Ni-17Co—Fe alloy was prepared.

On the other hand, as Comparative Example 11, a clad material made of a 72Ag—Cu alloy and pure Cu was prepared. As Comparative Example 12, a clad material made of a 72Ag—Cu alloy and pure Ni was prepared. As Comparative Example 13, a clad material made of a 72Ag—Cu alloy and a 30Ni—Cu alloy was prepared. As Comparative Example 21, a clad material made of an 85 g-Cu alloy and pure Cu was prepared.

Then, the softening heat treatment was performed on the clad materials according to Examples and Comparative Examples. Specifically, the heat treatment was performed for 3 minutes in a nitrogen atmosphere and a temperature environment of 700° C. Then, the cross sections of the clad materials according to Examples and Comparative Examples were observed with the scanning electron microscope to check the presence or absence of voids. Furthermore, surfaces of the clad materials according to Example 11 and Comparative Examples 11 and 12 after the softening heat treatment were observed with the scanning electron microscope to check the presence or absence of blisters caused by coarsening of voids.

In sectional photographs of the clad materials according to Examples 11 to 16 and 21 shown in FIGS. 16 to 21 and 28, no void was observed on interfaces between the silver brazing layers and the Fe layers. Furthermore, in a surface photograph of the clad material according to Example 11 shown in FIG. 25, no blister on a surface of the clad material was observed. On the other hand, in sectional photographs of the clad materials according to Comparative Examples 11 to 13 and 21 shown in FIGS. 22 to 24 and 29, voids were observed on interfaces between the silver brazing layers and the metal layers containing no Fe but containing at least one of Cu and Ni. Furthermore, in surface photographs of the clad materials according to Comparative Examples 11 and 12 shown in FIGS. 26 and 27, respectively, blisters on surfaces of the clad materials were observed. Consequently, it has been confirmable that in the case of the metal layers containing no Fe but containing at least one of Cu and Ni, voids and blisters occur by the softening heat treatment.

It has been confirmable from the results of Examples 12 to 15 (particularly Example 14 (the Fe layer is made of the 50Ni—Fe alloy)) shown in FIGS. 17 to 20 that even when the Fe alloy contains Ni that forms solid solution with Cu, occurrence of voids can be suppressed so far as the Fe alloy contains Fe. The Fe alloy containing Ni contained 50 mass % or more of Fe, whereby occurrence of voids may have been more reliably suppressed. Furthermore, Cr and Co are not solid-dissolved in Ag and Cu contained in the silver brazing layer, and hence it is believed that even when the Fe alloy containing 50 mass % or more of Fe, Cr, and Co in total is used for the Fe layer, occurrence of voids can be reliably suppressed similarly to the clad materials according to Examples 12 to 15.

From the results of Example 21 and Comparative Example 21 shown in FIGS. 28 and 29, even when the 85Ag—Cu alloy was used for the silver brazing layer, occurrence of voids could be suppressed in Example 21 containing the Fe layer, and voids occurred in Comparative Example 21 including the metal layer containing no Fe but containing at least one of Cu and Ni. From this, it has been confirmable that occurrence of voids can be suppressed by the Fe layer regardless of the content percentages of Ag and Cu of the silver brazing layer.

From the surface photographs of the clad materials according to Comparative Examples 11 and 12 shown in FIGS. 26 and 27, respectively, the occurrence amount of blisters in Comparative Example 11 became larger than the occurrence amount of blisters in Comparative Example 12, and the size of the blisters in Comparative Example 11 became larger than the size of the blisters in Comparative Example 12. From this, it has been proved that when the intermediate layer that contains Cu is provided in the clad material of which the hermetic sealing lid member is made, the diffusion suppression effect of the Fe layer is more effectively exerted.

The embodiments and Examples disclosed this time must be considered as illustrative in all points and not restrictive. The range of the present invention is shown not by the above description of the embodiments and Examples but by the scope of claims for patent, and all modifications within the meaning and range equivalent to the scope of claims for patent are further included.

For example, while the example in which the Ni layer 25 or 125 is provided in the clad material 20 or 120 of which the lid member 10 or 110 is made has been shown in each of the aforementioned first and second embodiments, the present invention is not restricted to this. According to the present invention, no Ni layer may be provided in the clad material of which the hermetic sealing lid member is made. In other words, the clad material may be two-layered or four-layered. For example, the two-layered clad materials according to Examples 11 to 16 and 21 may be directly used for the hermetic sealing lid member. At this time, as braze bonding between the lid member and the base, laser welding is more preferable than seam welding. Furthermore, the clad material of which the hermetic sealing lid member is made may have a six or more-layered structure.

While the example in which the intermediate layer 23 is made of pure Cu has been shown in the aforementioned first embodiment, the present invention is not restricted to this. According to the present invention, the intermediate layer is directed to one that contains at least one of Cu and Ni. In other words, the intermediate layer may be made of pure Ni, a Ni—Cu based alloy, or the like such as NW2201 (JIS standards). The Ni—Cu based alloy includes a 30Ni—Cu alloy that contains about 30 mass % of Ni, inevitable impurities, and the balance Cu, for example.

When the intermediate layer is made of Ni, under a temperature condition of about 650° C. or more, the intermediate layer hardly forms solid solution with Ag contained in the silver brazing layer, but easily forms solid solution with Cu contained in the silver brazing layer. Thus, when the silver brazing layer and the intermediate layer made of Ni are in direct contact with each other, voids occur by the softening heat treatment as in the aforementioned Comparative Examples 2 and 12. When the intermediate layer is made of the Ni—Cu based alloy, under the temperature condition of about 650° C. or more, the intermediate layer easily forms solid solution with both Ag and Cu contained in the silver brazing layer. Thus, when the silver brazing layer and the intermediate layer made of the Ni—Cu based alloy are in direct contact with each other, voids occur by the softening heat treatment as in the aforementioned Comparative Example 13. However, it is believed that the Fe layer is provided between the silver brazing layer and the intermediate layer as in the present invention such that diffusion of Ag and Cu contained in the silver brazing layer into the intermediate layer is suppressed.

While the example in which the recess portion 13 and the flange 14 are formed on the lid member 10 (110) has been shown in each of the aforementioned first and second embodiments, the present invention is not restricted to this. According to the present invention, no flange may be formed on the lid member, but only the recess portion may be formed on the lid member.

While the example in which the base material layer 24 (second Fe layer) has a Vickers hardness of about 110 HV or more and about 200 HV or less has been shown in the aforementioned first embodiment, the present invention is not restricted to this. According to the present invention, the Vickers hardness of the second Fe layer may be less than about 110 HV or more than about 200 HV. When particularly the thickness of the second Fe layer does not account for a large percentage with respect to the thickness of the clad material, the influence of the Vickers hardness of the second Fe layer is reduced at the time of bending. Thus, it is believed that even when the Vickers hardness of the second Fe layer becomes less than about 110 HV or more than about 200 HV, occurrence of cracks in bending can be sufficiently suppressed while deformation of the hermetic sealing lid member caused by external force or the like is suppressed.

While the example in which the Fe layer 122 (first Fe layer) has a Vickers hardness of about 110 HV or more and about 200 HV or less has been shown in the aforementioned second embodiment, the present invention is not restricted to this. According to the present invention, the Vickers hardness of the first Fe layer may be less than about 110 HV or more than about 200 HV.

While the example in which the clad material 20 or 120 has an elongation (a rate of fracture elongation) of about 10% or more has been shown in each of the aforementioned first and second embodiments, the present invention is not restricted to this. According to the present invention, the clad material may have an elongation of less than about 10%.

While the example in which the Ni layer 25 or 125 is made of pure Ni has been shown in each of the aforementioned first and second embodiments, the present invention is not restricted to this. According to the present invention, the Ni layer may be made of a Ni alloy. Alternatively, the Ni layer may not be prepared by roll bonding to another layer, but a lid member having a Ni plated layer (Ni layer) may be formed by pressure-bonding a metal layer other than the Ni layer first and thereafter performing Ni plating.

While the example in which the clad material 20 or 120 is of an overlay type has been shown in each of the aforementioned first and second embodiments, the present invention is not restricted to this. According to the present invention, the clad material may be an inlay clad material or the like. At this time, it is necessary to form at least the silver brazing layer and the first Fe layer on a bonding portion (the flange in FIG. 1, for example) between the clad material and the electronic component arrangement member in the clad material.

DESCRIPTION OF REFERENCE NUMERALS

10, 110: lid member (hermetic sealing lid member)
13: recess portion
20, 120: clad material
21, 121: silver brazing layer
22, 122: Fe layer (first Fe layer)
23: intermediate layer
24: base material layer (second Fe layer)
25: Ni layer
30: base (electronic component arrangement member)
40: electronic component
100: package (electronic component housing package)

The invention claimed is:

1. A method for manufacturing a hermetic sealing lid member used for an electronic component housing package including an electronic component arrangement member on which an electronic component is arranged, comprising:

forming a clad material in which a silver brazing layer that contains Ag and Cu and a first Fe layer arranged on the silver brazing layer and made of Fe or an Fe alloy are bonded to each other by roll-bonding a silver brazing plate that contains Ag and Cu and a first Fe plate made of Fe or an Fe alloy to each other and performing first heat treatment for diffusion annealing at a temperature of 600° C. or more and 700° C. or less;

softening the clad material by performing second heat treatment at a temperature of at least 700° C. and less than a melting point of the silver brazing layer or performing the second heat treatment for a longer time than a time of the first heat treatment at a temperature of at least 650° C. and less than 700° C.; and forming the hermetic sealing lid member in a box shape including a recess portion by bending the softened clad material.

2. The method for manufacturing a hermetic sealing lid member according to claim 1, wherein the forming of the clad material includes forming the clad material in which the silver brazing layer, the first Fe layer, an intermediate layer that is arranged on the first Fe layer and contains at least one of Cu and Ni, and a second Fe layer arranged on the intermediate layer and made of Fe or an Fe alloy are bonded to each other by roll-bonding the silver brazing plate, the first Fe plate, a plate for the intermediate layer that contains at least one of Cu and Ni, and a second Fe plate made of Fe or an Fe alloy to each other and performing the first heat treatment.

3. The method for manufacturing a hermetic sealing lid member according to claim 2, wherein the softening of the clad material includes setting a Vickers hardness of the second Fe layer of the clad material to 110 HV or more and 200 HV or less by performing the second heat treatment.

4. The method for manufacturing a hermetic sealing lid member according to claim 1, wherein the softening of the clad material includes softening the clad material such that the clad material has a rate of elongation of 10% or more by performing the second heat treatment.

5. The method for manufacturing a hermetic sealing lid member according to claim 1, wherein the forming of the clad material includes forming the clad material in which the silver brazing layer, the first Fe layer, and a Ni layer that constitutes an outermost layer on a side opposite to the silver brazing layer and contains Ni are bonded to each other by roll-bonding the silver brazing plate, the first Fe plate, and a Ni plate that contains Ni to each other and performing the first heat treatment.

* * * * *